US012585901B1

(12) United States Patent
Mills et al.

(10) Patent No.: US 12,585,901 B1
(45) Date of Patent: Mar. 24, 2026

(54) THUMB-TRIGGERED WEARABLE DEVICE AND SYSTEM

(71) Applicant: SOCKET MOBILE, INC., Fremont, CA (US)

(72) Inventors: Kevin J Mills, Vattiz (CH); James William Rebello, Lincoln, CA (US); Richard Brack, Buchs AG (CH); Vanessa Esther Lindsay, San Francisco, CA (US)

(73) Assignee: SOCKET MOBILE, INC., Fremont, CA (US)

( * ) Notice: Subject to any disclaimer, the term of this patent is extended or adjusted under 35 U.S.C. 154(b) by 0 days.

(21) Appl. No.: 18/703,196

(22) PCT Filed: Jan. 2, 2024

(86) PCT No.: PCT/IB2024/050035
§ 371 (c)(1),
(2) Date: Jun. 6, 2025

(87) PCT Pub. No.: WO2024/147090
PCT Pub. Date: Jul. 11, 2024

Related U.S. Application Data

(60) Provisional application No. 63/436,675, filed on Jan. 2, 2023, provisional application No. 63/446,266, filed
(Continued)

(51) Int. Cl.
*G06K 7/10* (2006.01)
*H05K 5/00* (2006.01)

(52) U.S. Cl.
CPC ..... *G06K 7/10396* (2013.01); *G06K 7/10297* (2013.01); *H05K 5/0086* (2013.01); *G06K 2007/10534* (2013.01)

(58) Field of Classification Search
CPC ........... G06K 7/10396; G06K 7/10297; H05K 5/0086
(Continued)

(56) References Cited

U.S. PATENT DOCUMENTS

| | | | |
|---|---|---|---|
| 7,837,112 B2 * | 11/2010 | An | G06K 7/10891 235/462.43 |
| 8,196,787 B2 * | 6/2012 | Strandberg | A45F 3/14 224/267 |

(Continued)

OTHER PUBLICATIONS

International Search Report in PCT/IB2024/050035 (the international stage of the instant case), Apr. 17, 2024, 3 pages.
(Continued)

*Primary Examiner* — Ahshik Kim
(74) *Attorney, Agent, or Firm* — PatentVentures; Bennett Smith

(57) ABSTRACT

Methods and apparatuses are disclosed for triggering a back-of-the-hand-worn electronic device (such as a scanner) via a trigger button toward the end of a removable flexible trigger button assembly or arm that is left/right-handed reversable in accordance with the preference of the user. The flexible trigger button assembly has at least a portion that is user bendable and twistable over a wide range to a desired user-customized static configuration for optimal ergonomic placement of a trigger button relative to the user's thumb. In a second embodiment, the flexible trigger button assembly instead has a simple cable terminating in a trigger button ring assembly that can be secured on the user's forefinger. Both embodiments allow each user to press the trigger button more easily, comfortably, and repeatedly.

24 Claims, 10 Drawing Sheets

Related U.S. Application Data on Feb. 16, 2023, provisional application No. 63/609,
330, filed on Dec. 12, 2023.

(58) Field of Classification Search
USPC ........................................................ 235/451
See application file for complete search history.

(56) References Cited

U.S. PATENT DOCUMENTS

| | | | | |
|---|---|---|---|---|
| 9,224,027 | B2 * | 12/2015 | Van Horn | .......... G06K 7/10722 |
| 9,727,769 | B2 * | 8/2017 | Oberpriller | ........ G06K 7/10891 |
| 12,137,759 | B2 * | 11/2024 | Guenther | ............. A61B 5/6806 |
| 2012/0187192 | A1 | 7/2012 | Lee | |
| 2014/0249944 | A1 | 9/2014 | Hicks et al. | |
| 2020/0150714 | A1 | 5/2020 | Sakamoto et al. | |
| 2020/0272801 | A1 | 8/2020 | Mistkawi et al. | |
| 2020/0305522 | A1 | 10/2020 | Ruhland et al. | |

OTHER PUBLICATIONS

Written Opinion of the International Searching Authority in PCT/
IB2024/050035 (the international stage of the instant case), Apr. 17,
2024, 8 pages.
Written Opinion of the International Preliminary Examining Author-
ity in PCT/IB2024/050035 (the international stage of the instant
case), Feb. 21, 2025, 8 pages.
International Preliminary Report On Patentability in PCT/IB2024/
050035 (the international stage of the instant case), Apr. 22, 2025,
8 pages.

* cited by examiner

220

225

222

220-2

220-1

220-3

220

220-1

220-2

220-3

THUMB-TRIGGERED WEARABLE DEVICE AND SYSTEM

CROSS REFERENCE TO RELATED APPLICATIONS

To the extent permitted by the type of the instant application, this application incorporates by reference for all purposes the following applications, all commonly owned with the instant application not later than the effective filing date of the instant application:

U.S. Provisional Patent Application Ser. No. 63/436,675, filed on Jan. 2, 2023, first named inventor Kevin J. MILLS, and entitled FLEXIBLE THUMB TRIGGER AND WEARABLE DEVICES USE SAME;

U.S. Provisional Patent Application Ser. No. 63/446,266, filed on Feb. 16, 2023, first named inventor Kevin J. MILLS, and entitled FLEXIBLE THUMB TRIGGER AND WEARABLE DEVICES USE SAME; and U.S. Provisional Patent Application Ser. No. 63/609,330, filed on Dec. 12, 2023, first named inventor Kevin J. MILLS, and entitled THUMB-TRIGGERED WEARABLE DEVICE AND SYSTEM.

BACKGROUND

Field

Advancements in triggers for hand worn electronic devices are needed to provide improvements in cost, profitability, performance, efficiency, and utility of use.

Related Art

Unless expressly identified as being publicly or well known, mention herein of techniques and concepts, including for context, definitions, or comparison purposes, should not be construed as an admission that such techniques and concepts are previously publicly known or otherwise part of the prior art. All references cited herein (if any), including patents, patent applications, and publications, are hereby incorporated by reference in their entireties, whether specifically incorporated or not, for all purposes.

In a warehouse pick and pack type environment, having both hands free is paramount to doing the job in an efficient and safe manner. However, these workers also need to be able to scan items they are picking, or locations they pick from, or the cart they place the item into. While solutions such as a belt mounted scanner, or one worn on a lanyard around the neck can work, this gets rather old and tiring after a while, and can cause the scanner to be subjected to unnecessary banging around.

A more elegant solution is to have the scanner mounted somewhere ergonomic for scanning, but not in the way for a pick and pack application. Wrist mounted scanners have been used. Another option is to mount the scanner on the back of the hand, just before the wrist. This allows the user to aim the scanner easily and still leaves the hand free for grabbing items.

A first problem with a hand mounted scanner approach is determining the best location and positioning on the user's hand. Usually, a compromise placement is chosen that can work for most people but may not be optimum for any one person. A second problem is how to best trigger the scan action. Triggering is usually done with a button. However, having to press a button with the other hand makes this rather cumbersome. Another option is to have the scanner 'always scanning', but this will cause the battery to deplete too quickly, as well as lead to frequent unintended scan events. Another option is voice activation, but in a noisy warehouse, this too can be problematic.

A better solution is to allow for a button on the same hand as the scanner. However, finding a button position that is ergonomic and durable and fits a variety of hand sizes as well as left hand or right hand can be very difficult. Solutions include a palm-based button, or a button that is between the index and middle finger (e.g., attached to an associated finger ring), but these positions are not very ergonomic if done many times. Having the button between the thumb and side of the hand has proven to be the most effective position, however, getting a button mounted in that location without being in the way is difficult. Thus, improvements are needed in methods of triggering a scanner worn on the back of a user's hand that is ergonomic, cost effective, and flexible.

SYNOPSIS

The invention may be implemented in numerous ways, e.g., as a process, an article of manufacture, an apparatus, a system, a composition of matter, and a computer readable medium such as a computer readable storage medium (e.g., media in an optical and/or magnetic mass storage device such as a disk, an integrated circuit having non-volatile storage such as flash storage), or a computer network wherein program instructions are sent over optical or electronic communication links. The Detailed Description provides an exposition of one or more embodiments of the invention that enable improvements in cost, profitability, performance, efficiency, and utility of use in the field identified above. The Detailed Description includes an Introduction to facilitate understanding of the remainder of the Detailed Description. The Introduction includes Example Embodiments of one or more of systems, methods, articles of manufacture, and computer readable media in accordance with concepts described herein. As is discussed in more detail in the Conclusions, the invention encompasses all possible modifications and variations within the scope of the issued claims.

A method and apparatus are disclosed for triggering (actuating) an electronic device (such as a scanner or other data capture module, or other application-specific functional unit) worn on the dorsal portion (the dorsum, or back) of a user's (worker's) hand via a trigger button toward a first end of a removable and left/right-handed reversable trigger switch assembly. In either handedness scenario, a connector (plug) portion toward a second end of the trigger switch assembly is reversibly and removably mounted in a bilaterally symmetric channel (AKA transverse socket, or slot) in the near-front bottom of the back-of-hand device. The ends of the trigger switch assembly are mechanically and electrically connected according to embodiment (as detailed below) via an intermediate portion. The connector portion is oriented (according to the chosen handedness) such that the balance (the intermediate portion and the trigger button first end) of the trigger switch assembly extends from the lower front forefinger (index-finger) side of the back-of-hand device and such that the trigger button may be positioned according to embodiment for efficient and comfortable activation by the user's thumb (the thumb and forefinger being that of the chosen hand). More generally, the combination and placement help to enhance user safety, health, comfort, and productivity.

In various embodiments and/or usage scenarios, a trigger switch assembly length beyond that required for ergonomic operation of the trigger button by the user's thumb is avoided, thus saving on material weight and costs and reducing the mechanical exposure/profile physical hazard of the trigger switch assembly (the susceptibility of the exposed portions of the trigger switch assembly to getting caught on other objects in the workplace environment while worn or wielded by the user). The placement of the trigger button may be chosen according to the expected or identified preferences of a nominal average user or other criteria. Examples of such other criteria include consideration of one or more human factors, such as user characteristics (including anthropometry, biomechanics, fatigue, and dexterity), factors related to the electronic device and the data capture tasks to be performed, and other work requirements. The consideration may include a chosen weighting of the human factors to arrive at a determined optimal placement (defined by the chosen weighting) of the trigger button for one or more usage scenarios. Determination of the overall length of the trigger switch assembly, and the span of the intermediate portion of the trigger switch assembly, follows directly from the chosen trigger button placement and in view of the characteristics/dimensions of the first and second ends and avoiding excess length.

In various embodiments and/or usage scenarios, the electronic device is positioned using hook-and-loop fasteners to a user-customized location on the back of a glove-like garment (e.g., a full glove, a partial-glove, or a hand wrap, a mitten, a partial-mitten, and including so-called fingerless gloves and fingerless mittens) worn on a preferred hand of the user. (This solves the first problem mentioned above.) In other various embodiments and/or usage scenarios, the electronic device is positioned using one or more hand and/or wrist straps (bands). In various embodiments and/or usage scenarios, the electronic device is a mobile battery powered device. In various embodiments and/or usage scenarios, in addition to any wireless sub-system for its primary application-specific functionality (e.g., RFID or NFC tag reading/writing), the electronic device includes at least one wireless sub-system for communications with one or more other systems (e.g., a so-called host computer, including a smartphone, tablet, or server) via respective wireless links.

In a first embodiment, the removable/reversible trigger switch assembly comprises a flexible arm and may be referred to variously as the trigger arm assembly, the removable arm, or the flexible arm. The flexible arm is mounted to the electronic device so as to protrude from a user-selected side of the electronic device, for respective right-handed or left-handed use, in accordance with the preference of the user. The flexible arm has at least a portion that is user bendable and twistable over a wide range yet holds to a desired user-customized static configuration for placement of the trigger button relative to the user's thumb. In this way the flexible arm allows each user to more easily, comfortably, and repeatedly press the trigger button. (This solves the second problem mentioned above.)

In a second embodiment, the trigger switch assembly comprises a flexible cable terminating in a ring assembly to be worn on (secured to) a user's forefinger (index-finger). The ring assembly is suitable for being worn on the user's forefinger (e.g., via a band or strap) and is also suitable for instead more permanently attaching (e.g., via sewing or thermal bonding) at least a base portion of the ring assembly to the glove-like garment. In various embodiments and/or usage scenarios, an upper (top) or button portion of the ring assembly is readily removably user-attachable to the base (lower, bottom) or finger strap portion of the ring assembly, using complementary geometries and various techniques such as snap-to-fit or magnetic attachment.

5 front and rear scanner-to-glove adapters, and the flexible thumb trigger arm assembly attached but not yet configured for a user's hand.

Figure 8:
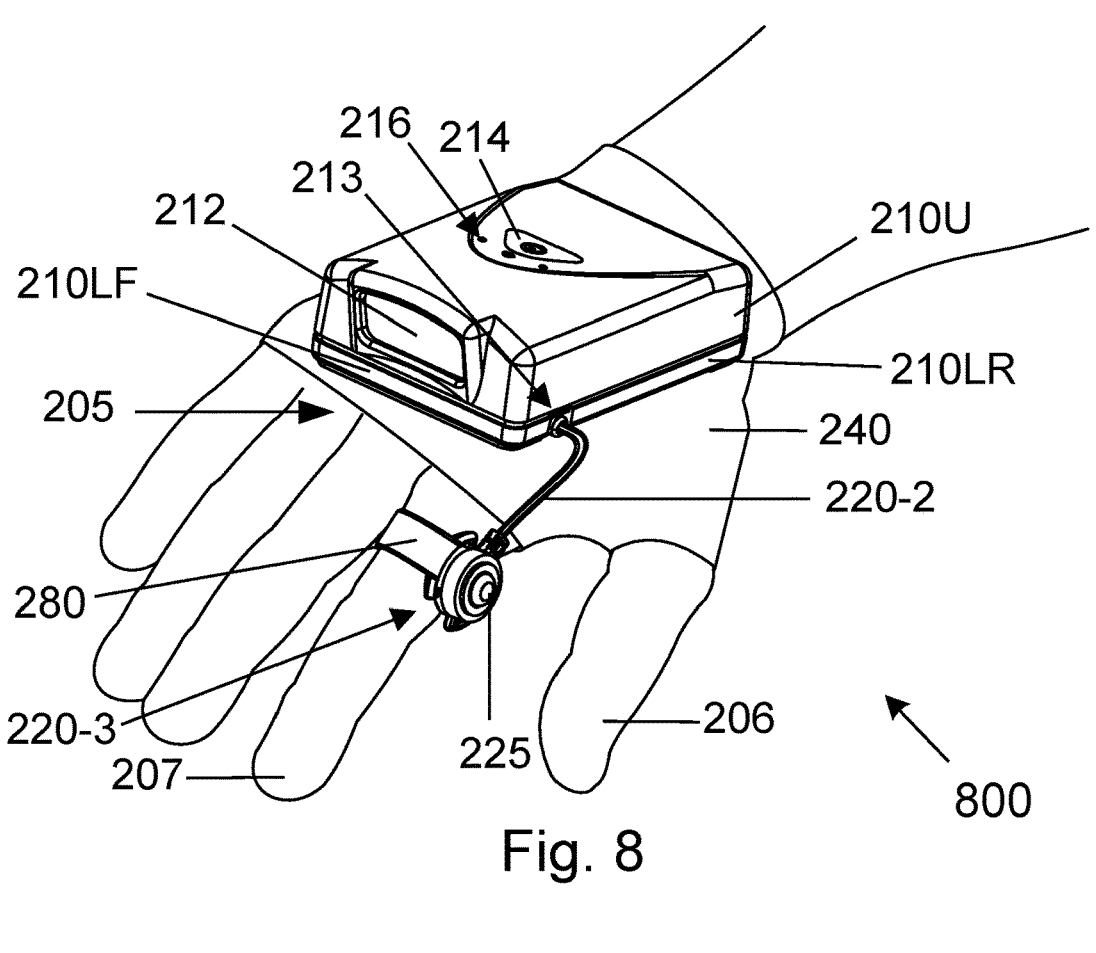
FIG. 8 illustrates, via a perspective view of a second embodiment, a scanner attached to a fingerless glove worn on the back of a user's hand, with a flexible trigger arm assembly attached and configured (bent into place for operational use by the user's thumb) for selective trigger activation of the scanner by the user's thumb.
Figure 9:
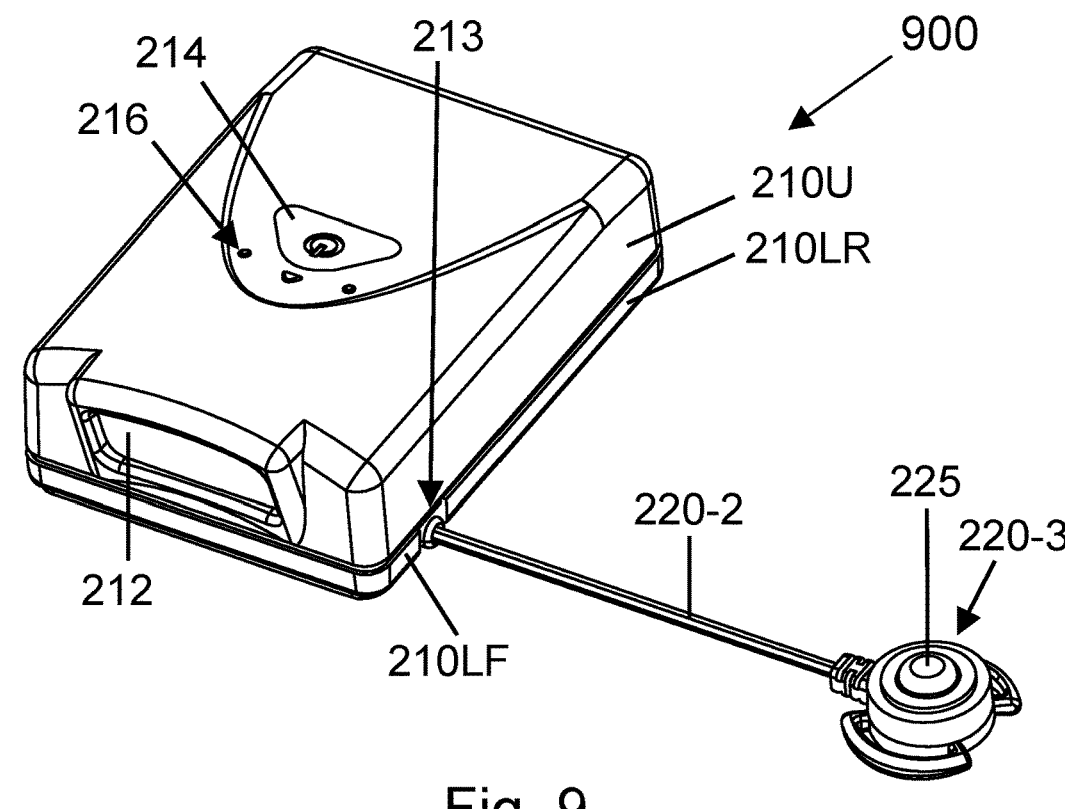
FIG. 9 illustrates again, via a perspective view of the second embodiment, the respective scanner and flexible trigger arm embodiments of FIG. 8, but sans the fingerless glove and the user's hand, and with flexible thumb trigger arm assembly attached but not yet configured. This view obliquely shows aspects of the scanner's upper portion, front, and side, as well as the visible front scanner-to-glove adapter.
Figure 10:
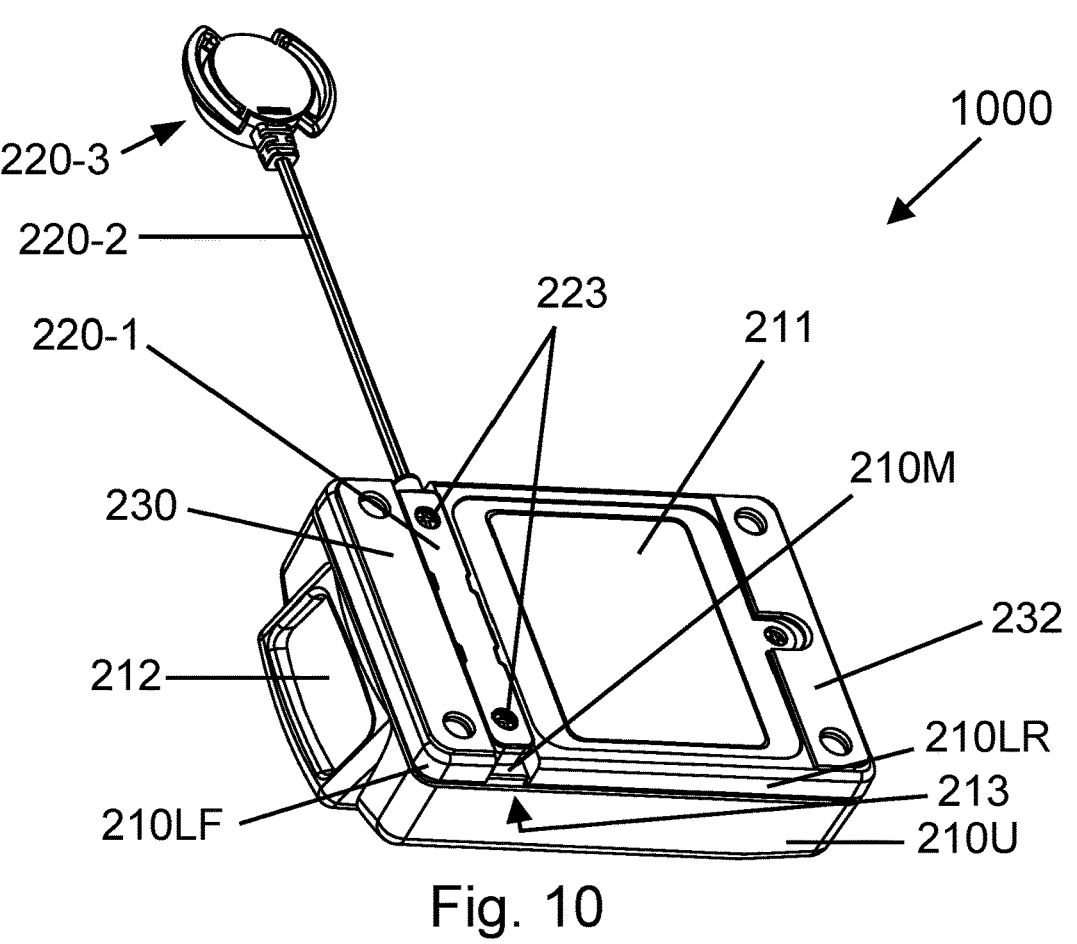
FIG. 10 illustrates, via a perspective view of the second embodiment, further selected physical details of the respective scanner and flexible trigger arm embodiments of FIGS. 8-9. This view obliquely shows aspects of the scanner's lower portions, side, and front, and further shows visible
Figure 11:
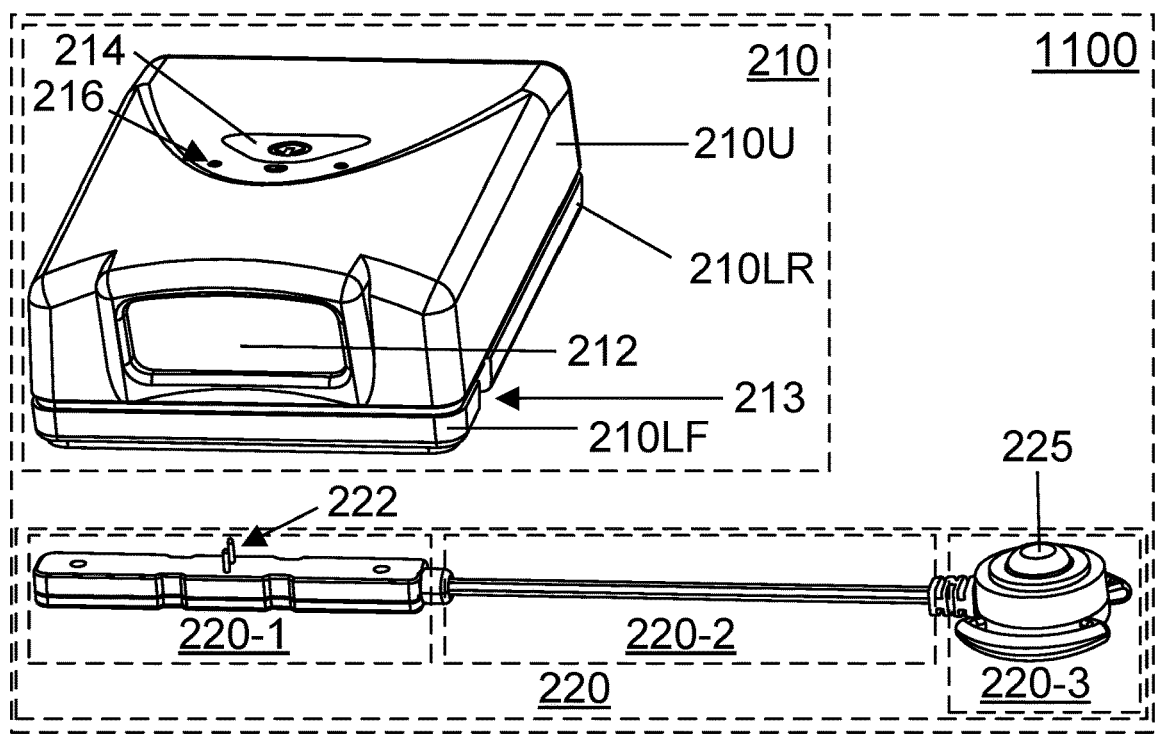

FIG. 11 illustrates, via a perspective view of the second embodiment, further selected physical details of the respective scanner and flexible trigger arm embodiments of FIGS. 8-10. This view obliquely shows aspects of the scanner's upper portion, front, and a side, and further shows a visible front scanner-to-glove adapter, and flexible thumb trigger arm assembly ready to be attached.

Figure 12:
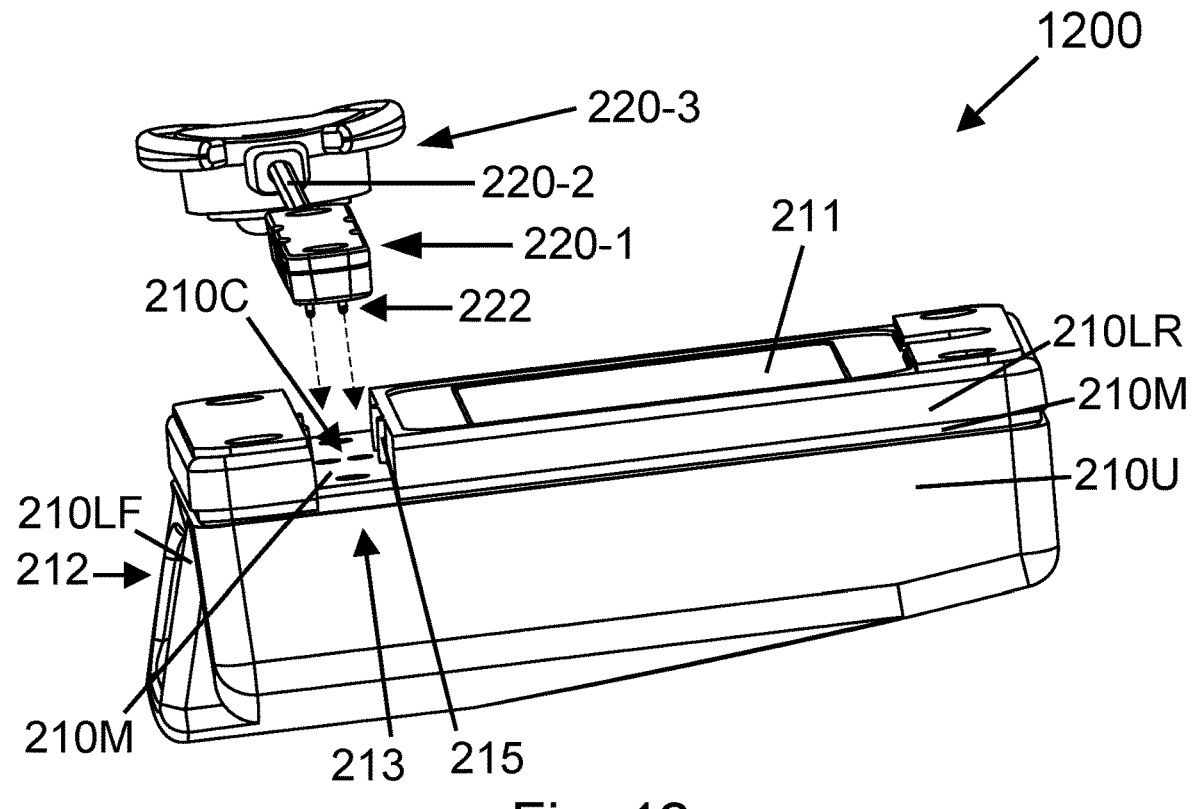

FIG. 12 illustrates, via a perspective view of the second embodiment, further selected physical details of the respective scanner and flexible trigger arm embodiments of FIGS. 8-11. This view obliquely shows aspects of the scanner's side, lower portions, and front.

Figure 13:
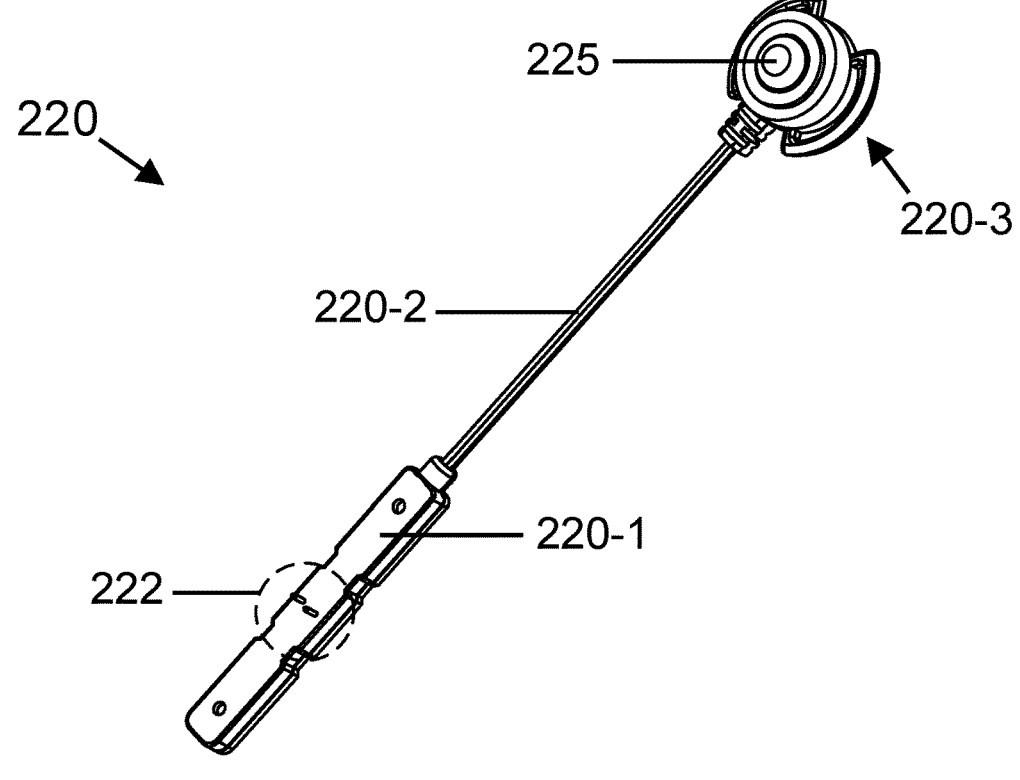

FIG. 13 illustrates, via a perspective view of the second embodiment, selected physical details of the flexible trigger arm assembly embodiment of FIGS. 8-12 and 14A-14B.

Figure 14A:
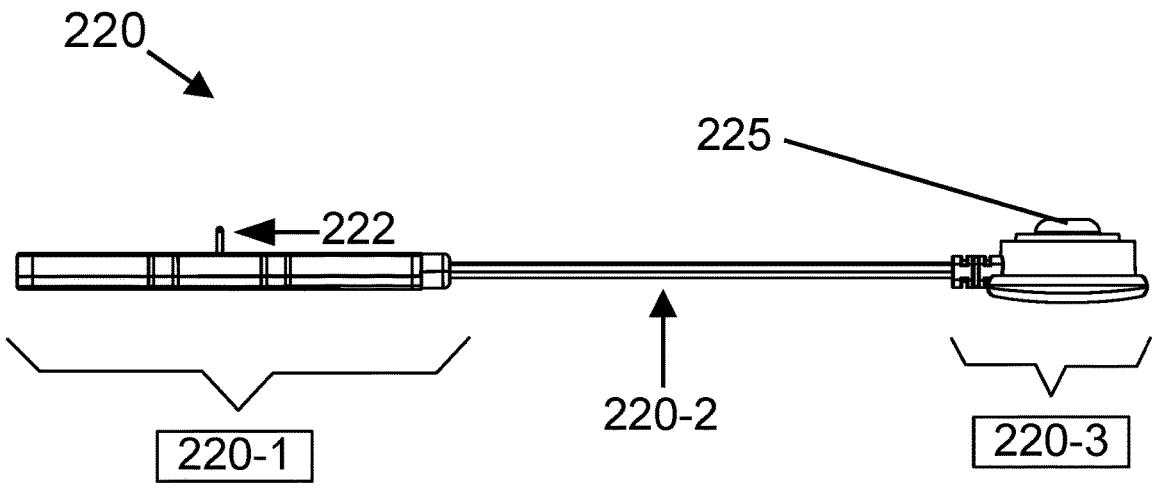

FIG. 14A illustrates, via a side view, selected aspects of the flexible trigger arm assembly of FIGS. 8-13 of the second embodiment.

6

Figure 14B:
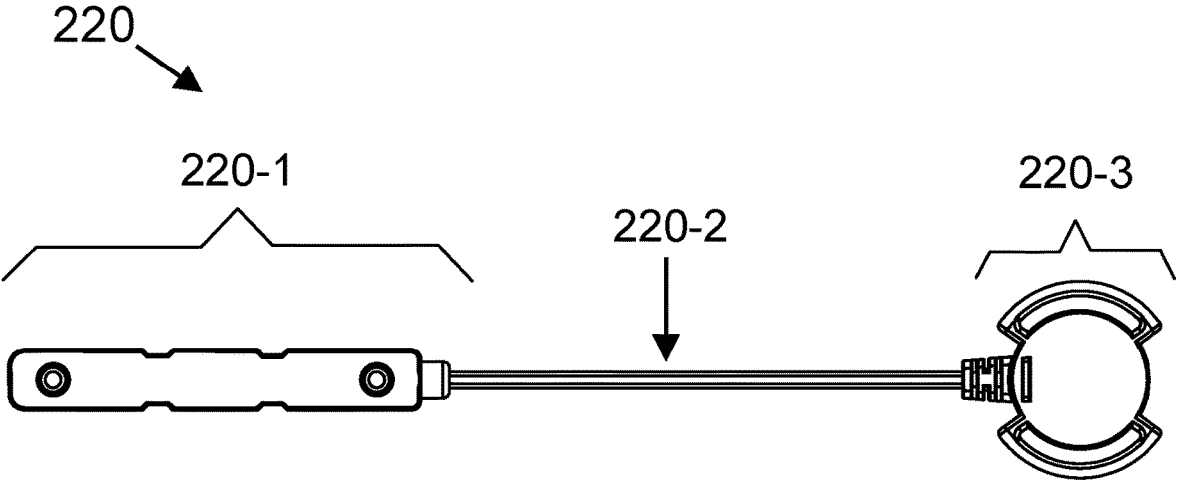

FIG. 14B illustrates, via a rear view, selected aspects of the flexible trigger arm assembly of FIGS. 8-13 of the second embodiment.

Figure 15A:
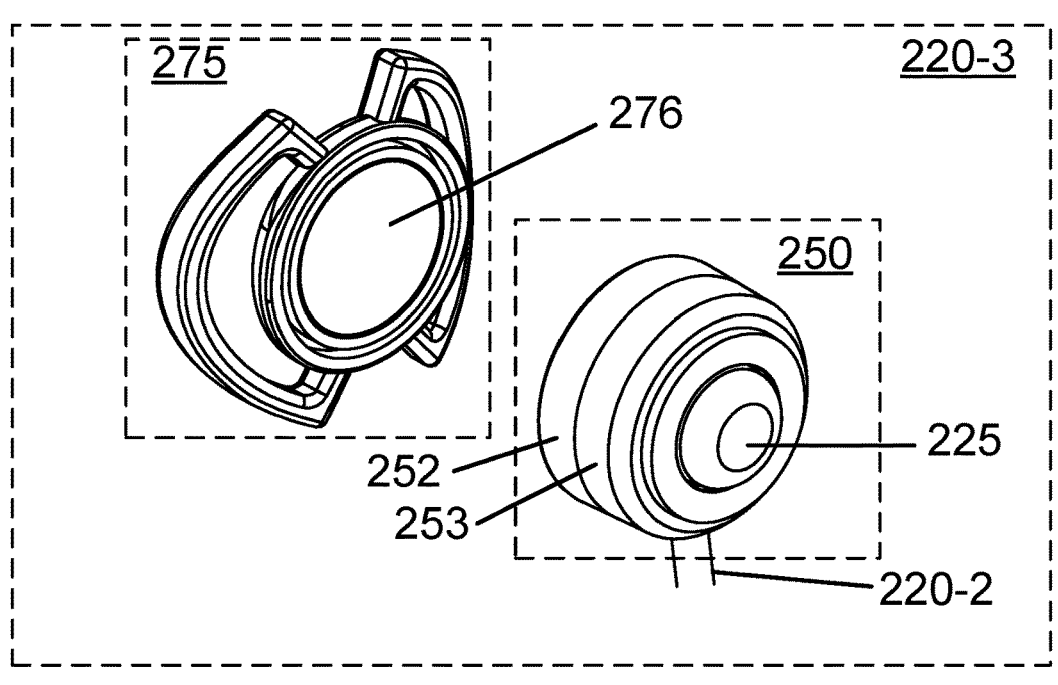

FIG. 15A illustrates, via a front perspective view, selected aspects of the thumb ring assembly 220-3 of the embodiment of FIGS. 8-12 and 16.

Figure 15B:
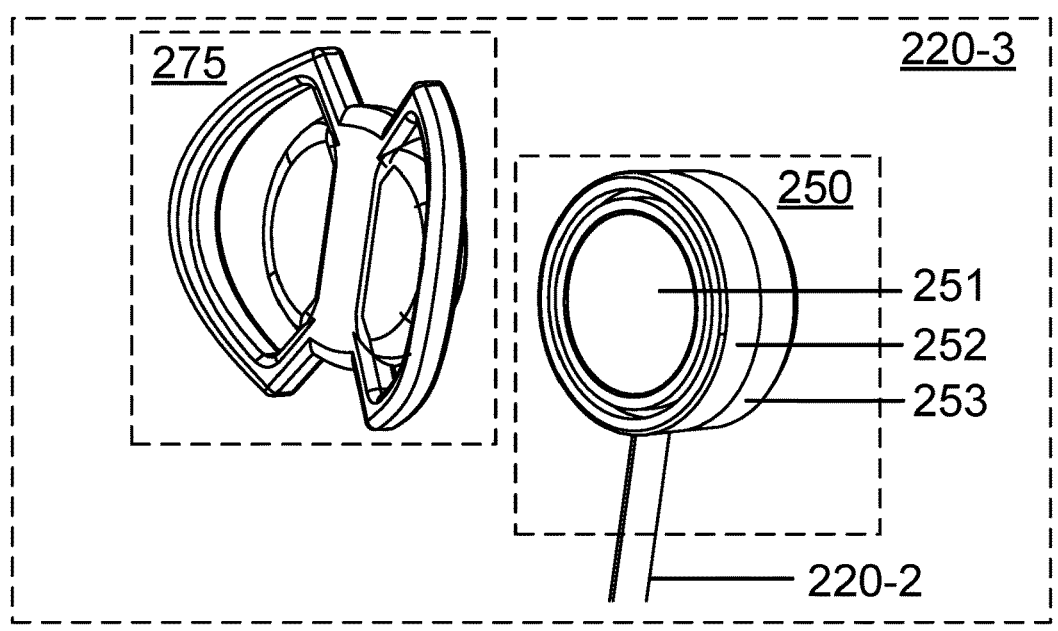

FIG. 15B illustrates, via a rear perspective view, selected aspects of the thumb ring assembly 220-3 of the embodiment of FIGS. 8-12 and 16.

Figures 16A, 16B, 16C, 16D:
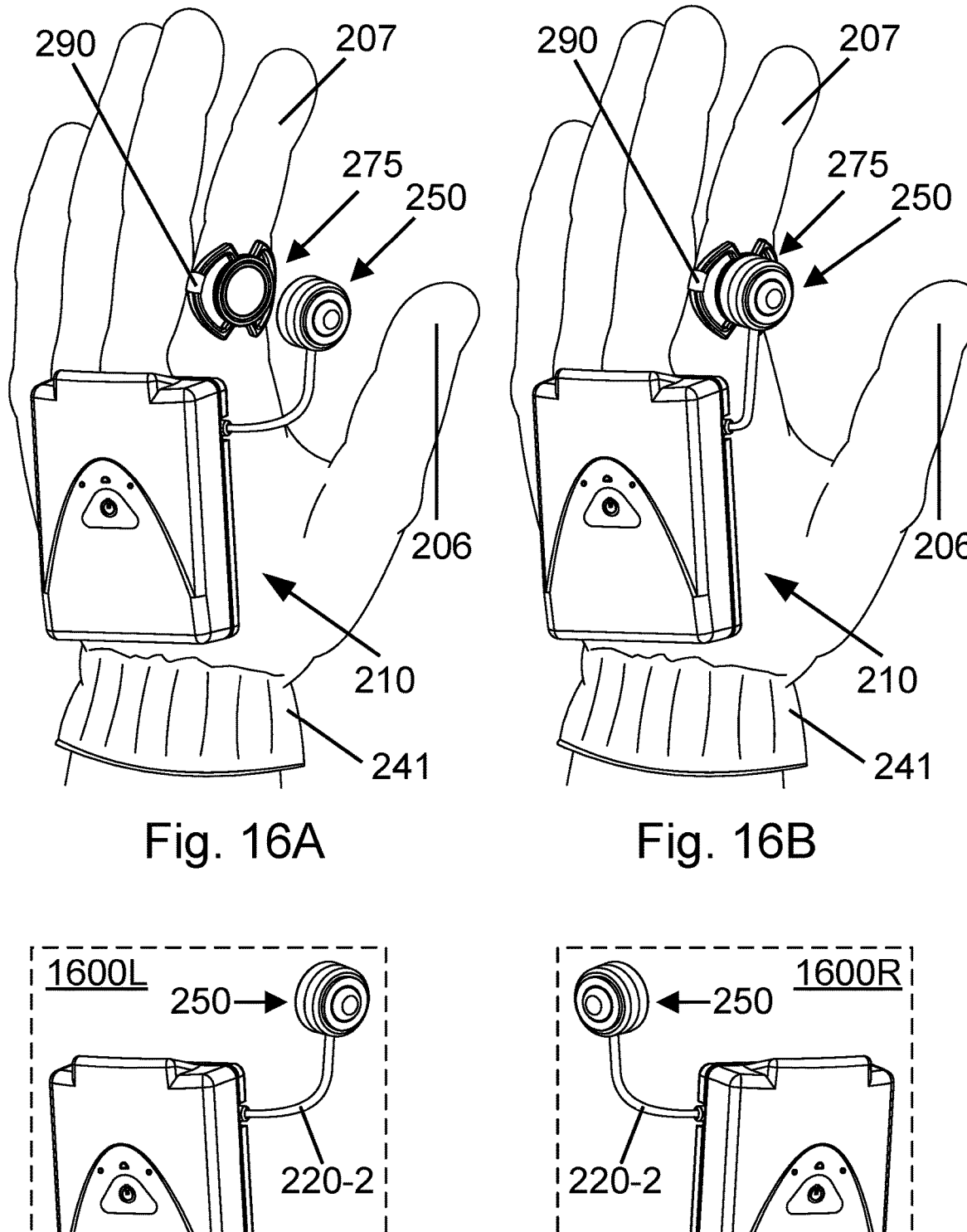

FIG. 16A and FIG. 16B illustrate via respective perspective views the head portion 250 of ring assembly 220-3 in respective detached and attached states regarding base portion 275 of the ring assembly 220-3 of the embodiment of FIGS. 8-12 and 15. FIG. 16C and FIG. 16D illustrate via respective views a left-hand configured and a right-hand configured scanning assembly for attachment to a glove pre-configured for ring mount applications of the second embodiment.

| List of Reference Symbols in Drawings | |
|---|---|
| Ref. Symbol | Element Name |
| 100 | Right-handed application of a scanner module worn on the back of a user's hand using a fingerless glove, with flexible trigger arm assembly attached and configured for selective trigger activation by the user's thumb (of a first embodiment) |
| 105 | User's hand (of a first embodiment) |
| 106 | User's thumb (of a first embodiment) |
| 107 | User's forefinger (of a first embodiment) |
| 110 | Scanner module (of a first embodiment) |
| 110C | External trigger input contacts (2 female receptacles) (of a first embodiment) |
| 110LR | Scanner Lower Rear portion (of a first embodiment) |
| 110LU | Scanner Lower Front portion (of a first embodiment) |
| 110M | Scanner Middle portion (of a first embodiment) |
| 110U | Scanner Upper portion (of a first embodiment) |
| 111 | Scanner access panel (of a first embodiment) |
| 112 | Scanner Front Window (of a first embodiment) |
| 113 | Scanner lower portion right/left-handed orientation channel (socket/ through slot) for guiding, retaining, and mating with the contact-pin end of the flexible trigger arm assembly (of a first embodiment) |
| 114 | Scanner user control(s) (of a first embodiment) |
| 115 | Ridges (channel protrusions) for providing an interference fit of the trigger arm in the right/left-handed orientation channel (of a first embodiment) |
| 116 | Scanner user indicator(s) (of a first embodiment) |
| 120 | Flexible trigger arm assembly with button and internal switch and external switch contacts (of a first embodiment) |
| 122 | Trigger switch output contacts (2 male pins) of the flexible trigger arm assembly (of a first embodiment) |
| 125 | Trigger button (of a first embodiment) |
| 130 | Front scanner-to-glove adapter (of a first embodiment) |
| 132 | Rear scanner-to-glove adapter (of a first embodiment) |
| 140 | Glove-like garment (of a first embodiment) |
| 200 | Scanner with visible front scanner-to-glove adapter, with flexible thumb trigger arm assembly attached but not yet configured (of a first embodiment) |
| 205 | User's hand (of a second embodiment) |
| 206 | User's thumb (of a second embodiment) |
| 207 | User's forefinger (of a second embodiment) |
| 210 | Scanner module (of a second embodiment) |
| 210C | External trigger input contacts (2 female receptacles) (of a second embodiment) |
| 210LR | Scanner Lower Rear portion (of a second embodiment) |
| 210LU | Scanner Lower Front portion (of a second embodiment) |
| 210M | Scanner Middle portion (of a second embodiment) |
| 210U | Scanner Upper portion (of a second embodiment) |
| 211 | Scanner access panel (of a second embodiment) |
| 212 | Scanner Front Window (of a second embodiment) |
| 213 | Scanner lower portion right/left-handed orientation channel (socket/ through slot) for guiding, retaining, and mating with the contact-pin end of the flexible trigger arm assembly (of a second embodiment) |
| 214 | Scanner user control(s) (of a second embodiment) |
| 215 | Ridges (channel protrusions) for aligning and retaining the trigger arm (of a second embodiment) |
| 216 | Scanner user indicator(s) (of a second embodiment) |

-continued

| List of Reference Symbols in Drawings | |
|---|---|
| Ref. Symbol | Element Name |
| 220 | Thumb trigger assembly with button and internal switch and external switch contacts (of a second embodiment), comprising 3 portions (220-1, 220-2, and 220-3, described below) |
| 220-1 | Interface (plug) portion of flexible trigger arm (of a second embodiment) |
| 220-2 | Cable portion of flexible trigger arm (of a second embodiment) |
| 220-3 | Ring assembly portion of Flexible trigger arm (of a second embodiment) |
| 222 | Trigger switch output contacts (2 male pins) of the flexible trigger arm assembly (of a second embodiment) |
| 223 | Screws for retaining the interface portion of the flexible trigger arm to the scanner module (of a second embodiment) |
| 225 | Trigger button (of a second embodiment) |
| 230 | Front scanner-to-glove adapter (of a second embodiment) |
| 232 | Rear scanner-to-glove adapter (of a second embodiment) |
| 240 | Glove-like garment (fingerless, of a second embodiment) |
| 241 | Glove-like garment (with full hand coverage, of a second embodiment) |
| 250 | Upper portion of ring assembly with trigger button (of a second embodiment) |
| 251 | Magnetic disk of upper portion of ring assembly (of a second embodiment) |
| 252 | Trigger button housing of upper portion of ring assembly (of a second embodiment) |
| 253 | Trigger button casing of upper portion of ring assembly (of a second embodiment) |
| 275 | Lower portion of ring assembly, with positioning anchor (of a second embodiment) |
| 276 | Ferromagnetic disk of lower portion of ring assembly (of a second embodiment) |
| 280 | Band for securing the ring assembly via the positioning anchor |
| 290 | Stitching for securing the ring assembly via the positioning anchor |
| 300 | Scanner with visible front and rear scanner-to-glove adapters, with flexible thumb trigger arm assembly attached but not yet configured (of a first embodiment) |
| 400 | Scanner with visible front scanner-to-glove adapter and flexible thumb trigger arm assembly ready to be attached (of a first embodiment) |
| 500 | Scanner with visible front and rear scanner-to-glove adapters and flexible thumb trigger arm ready to be attached (of a first embodiment) |
| 800 | Right-handed application of a scanner module worn on the back of a user's hand using a fingerless glove, with flexible trigger arm assembly attached and configured for selective trigger activation by the user's thumb (of a second embodiment) |
| 900 | Scanner with flexible thumb trigger arm assembly attached but not yet configured/positioned (of a second embodiment) |
| 1000 | Scanner with visible front and rear scanner-to-glove adapters, with flexible thumb trigger arm assembly attached but not yet configured/positioned (of a second embodiment) |
| 1100 | Scanner with flexible thumb trigger arm assembly ready to be attached (of a second embodiment) |
| 1200 | Scanner with visible front and rear scanner-to-glove adapters and flexible thumb trigger arm ready to be attached (of a second embodiment) |
| 1600L | Left-handed scanning assembly (of a second embodiment) |
| 1600R | Right-handed scanning assembly (of a second embodiment) |

DETAILED DESCRIPTION

A detailed description of one or more embodiments of the invention is provided below along with accompanying figures illustrating selected details of the invention. The invention is described in connection with the embodiments. The embodiments herein are understood to be merely exemplary; the invention is expressly not limited to or by any or all of the embodiments herein, and the invention encompasses numerous alternatives, modifications, and equivalents. To avoid monotony in the exposition, a variety of word labels (including but not limited to: first, last, certain, various, further, other, particular, select, some, and notable) may be applied to separate sets of embodiments; as used herein such labels are expressly not meant to convey quality, or any form of preference or prejudice, but merely to conveniently distinguish among the separate sets. The order of some operations of disclosed processes is alterable within the scope of the invention. Wherever multiple embodiments serve to describe variations in process, method, and/or program instruction features, other embodiments are contemplated that in accordance with a predetermined or a dynamically determined criterion perform static and/or dynamic selection of one of a plurality of modes of operation corresponding respectively to a plurality of the multiple embodiments. Numerous specific details are set forth in the following description to provide a thorough understanding of the invention. The details are provided for the purpose of example and the invention may be practiced according to the claims without some or all of the details. For the purpose of clarity, technical material that is known in the technical fields related to the invention has not been described in detail so that the invention is not unnecessarily obscured.

Introduction

This introduction is included only to facilitate the more rapid understanding of the Detailed Description; the invention is not limited to the concepts presented in the introduction (including explicit examples, if any), as the paragraphs of any introduction are necessarily an abridged view of the entire subject and are not meant to be an exhaustive or restrictive description. For example, the introduction that follows provides overview information limited by space and organization to only certain embodiments. There are many other embodiments, including those to which claims will ultimately be drawn, discussed throughout the balance of the specification.

Example Embodiments

In concluding the introduction to the detailed description, what follows is a collection of example embodiments, including at least some explicitly enumerated as "ECs" (Example Combinations), providing additional description of a variety of embodiment types in accordance with the concepts described herein; these examples are not meant to be mutually exclusive, exhaustive, or restrictive; and the invention is not limited to these example embodiments but rather encompasses all possible modifications and variations within the scope of the issued claims.

EC1) A wearable electronic device comprising:
a removable arm comprising a flexible outer molded body, an internal trigger switch and exposed trigger button at a first end, and a plurality of external contacts at a second end;
an application-specific module having at least one port with a plurality of internal contacts for removably mounting the flexible arm and receiving the flexible arm external contacts, wherein the application-specific module is configurable for placement on the back of a preferred hand of a user;
wherein the removable arm is mountable to the application-specific module and further flexibly configurable relative to a respective thumb of the user's preferred hand; and
wherein the configuration and placement of the removable arm and application-specific module are customizable for optimal ergonomic placement for exercising the trigger button by the user's thumb.

EC2) The wearable electronic device of EC1, wherein the exercising the trigger button causes a change in a state of the trigger switch that in turn causes a change in a state of the application-specific module.

EC3) The wearable electronic device of EC1, wherein the application-specific module is a scanner module and depressing the trigger button activates a scan.

EC4) The wearable electronic device of EC1, wherein the flexible outer molded body comprises a soft elastomer.

EC5) The wearable electronic device of EC1, wherein the external contacts are male pogo pins and the internal contacts are pogo target receptacles.

EC6) The wearable electronic device of EC1, wherein the flexible arm is mounted to the application-specific module in a selected one of a right-handed and a left-handed configuration corresponding to the user's preferred hand.

EC7) The wearable electronic device of EC1, further comprising a garment wearable on the user's preferred hand for bespoke removable attachment of the application-specific module on the back of the user's preferred hand.

EC8) The wearable electronic device of EC7, wherein the application-specific module is attached to the garment using hook-and-loop fasteners.

EC9) The wearable electronic device of EC7, wherein the garment is a fingerless glove.

EC10) The wearable electronic device of EC1, wherein the at least one port is a through slot in the lower portion of the application-specific module and the through slot and the internal contacts are symmetric about a long axis of the application-specific module.

EC11) The wearable electronic device of EC1, wherein the at least one port has teeth for gripping the mounted second end of the removable arm.

EC12) The wearable electronic device of EC1, wherein the removable arm further comprises internal signal interconnect electrically coupling the switch and the external contacts, and an internal armature to provide flexible stiffness.

EC13) The wearable electronic device of EC12, wherein the internal armature comprises a stiff wire.

EC14) A method comprising:
identifying a preferred hand of a user of an electronic module, the preferred hand having an associated forefinger;
attaching a removable thumb trigger assembly to the electronic module via a transverse bilaterally symmetric channel of the electronic module, wherein the attached thumb trigger assembly protrudes in part from the lower front forefinger side of the electronic module; and
removably positioning the electronic module and attached thumb trigger assembly atop the back of the user's hand via attachment to a glove-like garment worn on the user's preferred hand, the positioning being according to the user preference for placement of the thumb trigger.

EC15) The method of EC14, wherein no electrical components are required to be part of the glove-like garment.

EC16) The method of EC14, wherein no electronic module associated electrical interconnect is required to be integral to the glove-like garment.

EC17) The method of EC14, wherein the electronic module is a data capture module.

EC18) The method of EC14, wherein the electronic module is a scanner.

EC19) The method of EC18, wherein the scanner uses optical techniques enabled to scan optical targets including linear and two-dimensional barcodes, the two-dimensional barcodes including QR codes.

EC20) The method of EC18, wherein the scanner uses NFC techniques to scan NFC targets including NFC tags.

EC21) The method of EC14, wherein the thumb trigger assembly comprises a cable that terminates in a trigger button ring assembly, and further comprising securing a finger strap portion of the trigger button ring assembly to the user's forefinger.

EC22) The method of EC21, further comprising securing a user removably attachable trigger button portion of the trigger button ring to the finger strap portion.

EC23) The method of EC22, wherein the attachment is via magnetic retention.

EC24) An apparatus comprising:
an application-specific module for wearing atop the dorsal of a user's preferred hand, the module having an anterior side and a ventral side worn respectively oriented distally and proximally with respect to the user, the ventral anterior of the module having a transverse bilaterally symmetric channel;
a thumb trigger assembly comprising a channel-plug end, an end having a trigger button, and an intermediate portion mechanically and electrically connecting the channel-plug end and the trigger button end;
wherein the thumb trigger assembly is removably mechanically and electrically mounted in the channel via the channel-plug end in a selected one of a left-handed and a right-handed reversible orientation in accordance with the user's preference, and the intermediate portion protrudes from the module proximate to the user's preferred hand forefinger side; and wherein a thumb-relative quasi-static position of the trigger button is customizable for exercising the trigger button by the user's thumb to cause a module state change.

EC25) The method of EC24, wherein the application-specific module is a scanner module and the exercising activates a scan;
    wherein the wearing is via the attachment of the module to a glove-like garment and no module associated electrical interconnect is required to be integral to the garment;
    wherein the customizable position is an optimal ergonomic placement determined in accordance with a chosen weighting of human factors; and
    wherein the length of the intermediate portion is limited to that required by a predetermined ergonomic range for the customizable position.

Flexible Arm Mount Thumb-Triggered Wearable Device and System

Figures 1, 2:
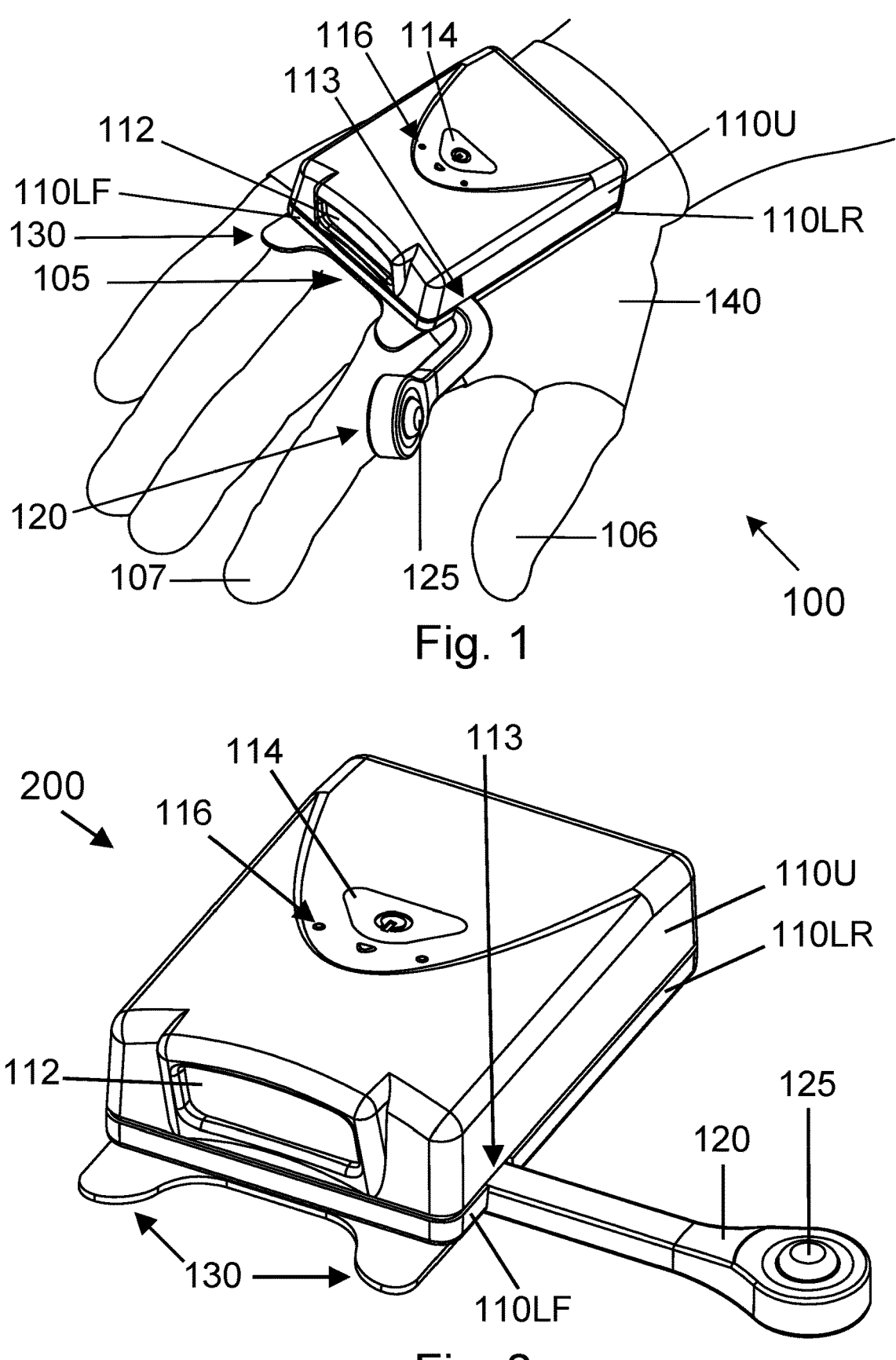
FIG. 1 illustrates, via a perspective view of a first embodiment, a scanner attached to a fingerless glove worn on the back of a user's hand, with a flexible trigger arm assembly attached and configured (bent into place for operational use by the user's thumb) for selective trigger activation of the scanner by the user's thumb.
FIG. 2 illustrates again, via a perspective view of the first embodiment, the respective scanner and flexible trigger arm embodiments of FIG. 1, but sans the fingerless glove and the user's hand, and with flexible thumb trigger arm assembly attached but not yet configured. This view obliquely shows aspects of the scanner's upper portion, front, and side, as well as the visible front scanner-to-glove adapter.

FIG. 1 illustrates, via a perspective view, a right-handed application 100 of a exemplary first or "flexible arm mount" embodiment of a wearable application-specific electronic device, here shown as a scanner module 110 worn on the back of a user's hand 105. As shown, a flexible arm thumb trigger assembly 120 is attached to scanner module 110 and configured to position the trigger button 125 into place for momentary depression by the user's thumb 106 for selective trigger signaling to the electronic device. More particularly, in FIG. 1 it is seen that the flexible arm 120 is positioned between the thumb 106 and forefinger 107 (index finger) such that the flexible arm 120 is captured between the two when the trigger button 125 is depressed. The flexible arm 120 rests on or in close proximity to the forefinger 107, such that the forefinger 107 acts as a backstop to constrain movement of the flexible arm 120 during button depression.

While the embodiment of FIG. 1 is that of activating a scan by an optical scanner, the removable reversable flexible arm with trigger button techniques disclosed herein for reversable right-handed vs. left-handed configuration, and for ergonomic placement of the trigger button with respect to the user's thumb, are equally applicable to other hand-worn application-specific electronic devices, including but not limited to NFC scanners, tally counters, and remote controls, particularly for applications involving placements or aiming involving hand movements. It will thus be understood that references throughout the main description to "the scanner" or the scanner module" can generally be considered as equivalent to references to "the application-specific electronic device" or "the application-specific module", with the application of the illustrated embodiment being that of scanning.

References herein to "the scanner" generally are context dependent, sometimes referring to the entire combination worn on the hand as illustrated in FIG. 1, sometimes referring to the combination of a "scanner module" (a main body portion to be detailed next) with the flexible trigger arm but sans the fingerless glove 140 and glove adapters 130 and 132 (the latter glove adapter only visible in FIGS. 3 and 5), and sometimes referring to just the scanner module 110 (sans the flexible trigger arm 120, fingerless glove 140, and glove adapters 130 and 132).

The application-specific electronic device may be positioned via various means on the back of any hand-covering garment securely worn on and generally covering at least the upper dorsal of a preferred hand of the user. Typically, the hand covering will be a glove-like or mitten-like garment, functioning also as a "work glove". The term glove-like garment is meant to broadly refer to any of a full glove, a partial-glove, a hand wrap, a mitten, a partial-mitten, and includes so-called fingerless gloves, fingerless mittens, and minor variations of the foregoing. The term "fingerless glove" is meant to broadly refer to hand coverings generally including at least partial tubes/sleeves for at least some of the proximal phalanges, but generally with the tubes/sleeves not extending to cover the distal phalanges. The term "fingerless mittens" is meant to broadly refer to hand coverings generally not having individual tubes/sleeves for the proximal phalanges. Minor variations of the glove-like garments include so-called "palmless" and "half-palm" gloves, and gloves with a thumb opening but without a partial tube/sleeve for the thumb.

Figures 3, 4:
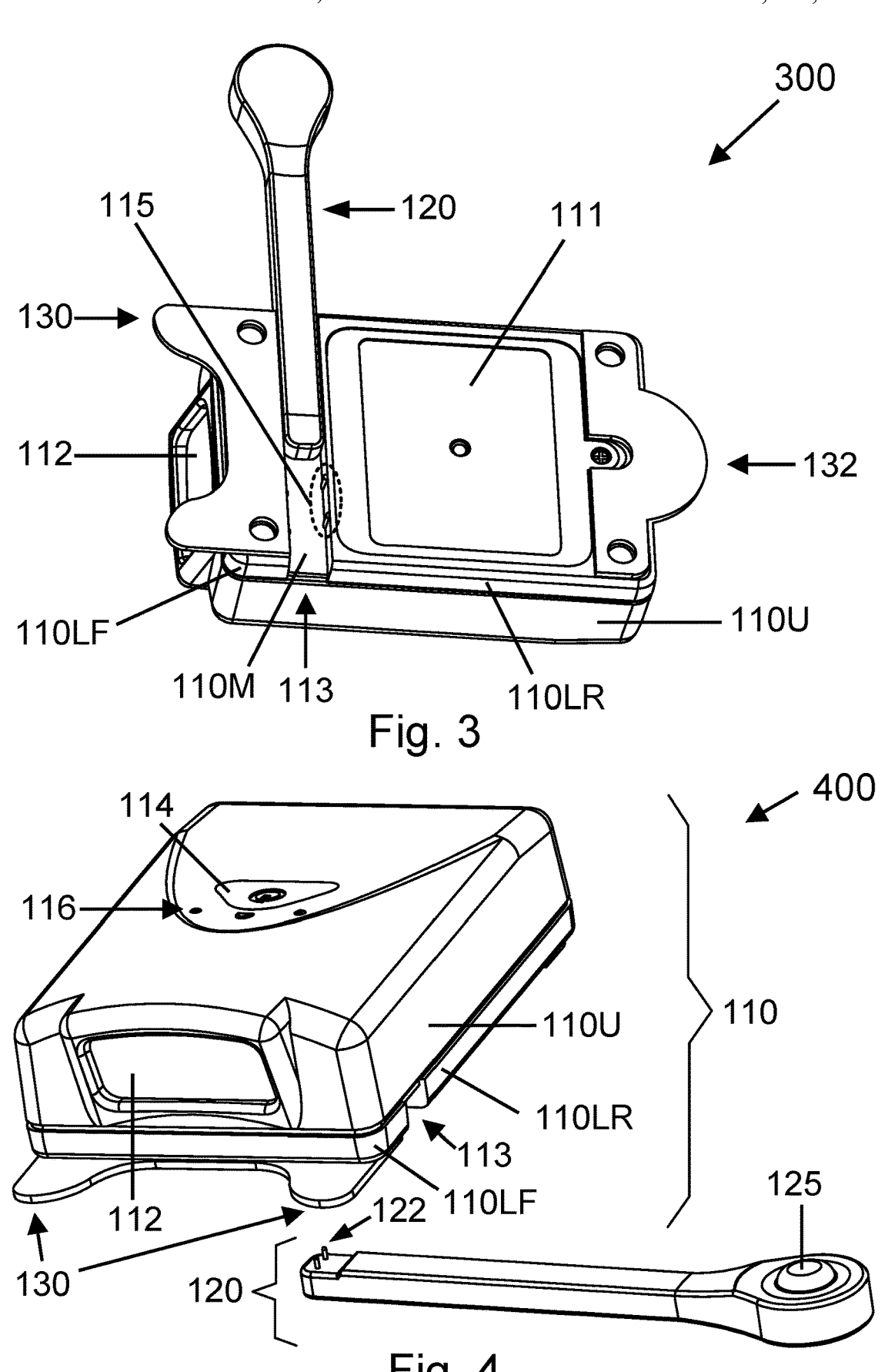
FIG. 3 illustrates, via a perspective view of the first embodiment, further selected physical details of the respective scanner and flexible trigger arm embodiments of FIGS. 1-2. This view obliquely shows aspects of the scanner's lower portions, side, and front, and further shows visible front and rear scanner-to-glove adapters, and the flexible thumb trigger arm assembly attached but not yet configured for a user's hand.
FIG. 4 illustrates, via a perspective view of the first embodiment, further selected physical details of the respective scanner and flexible trigger arm embodiments of FIGS. 1-3. This view obliquely shows aspects of the scanner's upper portion, front, and a side, and further shows a visible front scanner-to-glove adapter, and flexible thumb trigger arm assembly ready to be attached.

In broad overview, the scanner module 110 (AKA scan module) corresponds to the assembly in the upper left of FIG. 4, sans the scanner-to-glove adapter 130, and more particularly comprises upper portion 110U, middle portion 110M (visible only in FIGS. 3 and 5), front lower portion 110LF, rear lower portion 110LR, access panel 111 (visible only in FIGS. 3 and 5), front optical scanner window 112, module lower portion right/left-handed orientation channel 113 (AKA slot; detailed below in the discussion of FIGS. 3 and 5), external trigger input contacts 110C (visible only in FIG. 5), user control(s) 114, and user indicator(s) 116.

In various embodiments and/or usage scenarios, the glove-like garment includes loops or pockets for receiving the tab-like protrusions of the glove adapters 130 and 132. In various embodiments and/or usage scenarios, glove adapters 130 and 132 removably attach to fingerless glove 140 using hook-and-loop fasteners (Velcro-like technology). In other embodiments the glove adapters do not have the tab-like protrusions, and the attachment to the glove-like garment relies solely on hook-and-loop fasteners adhesively attached to the glove adapters. In the above ways and others, different right vs left versions and sizes of fingerless glove 140 are readily accommodated and the scanner can be positioned according to user preference and optimal ergonomics (in accordance with various human factors criteria, as discussed supra). According to embodiment and/or usage scenarios, glove adapters 130 and 132 are attached to the scanner module using an adhesive or additional hook-and-loop fasteners. In various embodiments and/or usage scenarios, the scanner module and flexible trigger arm 120 in combination are wearable via other back-of-hand attachment methods (including but not limited to straps using buckles or hook-and-loop fasteners). It will also be appreciated that once a preferred placement on the back of the user's hand is determined, a more user-size and user-preference-specific hand garment may be employed that more directly attaches with the scanner module, minimizing the need for one or more of the glove adapters 130 and 132 or the use of hook-and-loop fasteners.

The flexible trigger arm assembly 120 has at least a portion that is user bendable and twistable over a wide range to a desired user-customized (bespoke) static configuration for optimal ergonomic placement of the trigger button relative to the user's thumb. The configurability of the arm is loosely analogous to that of an appendage of a positionable toy figure, a clay sculpture built on a wire-based armature, or a stop-motion-animation character built on an articulated armature.

In various embodiments and/or usage scenarios, the flexible trigger arm 120 comprises a flexible outer molded body encapsulating the trigger button 125 and associated internal switch (not explicitly illustrated) at a first end, a plurality of external contacts 122 at a second end, signal interconnect electrically coupling the switch with the second end external contacts, and an inner structural framework to provide stiffness. According to embodiment and/or usage scenarios, the flexible outer molded body comprises silicone, rubber, soft polyvinyl chloride, or other elastomer (rubber-like solid). In various embodiments and/or usage scenarios, the elastomer is chosen to present a "soft" surface (a relatively low value of Shore Durometer hardness) at least on the back side of the trigger button.

It will be appreciated that there will be necessary tradeoffs required for the generally conflicting application goals regarding flexibility, stiffness, bending fatigue lifetime, and cost of the structural framework for the flexible trigger arm 120. According to embodiment and/or usage scenarios, the structural framework is an armature comprising one or more relatively stiff wires or cable strands (comprising a plurality of wires concentrically laid around a center wire) and/or one or more articulated segments. In various embodiments and/or usage scenarios, the armature comprises a single 10 to 20-gauge wire. According to embodiment and/or usage scenarios, an armature comprises one or more segments of one or more of a single wire, a pair of twisted wires, a strand of two or more wires concentrically laid around a center wire, a plurality of generally parallel wires, a wire lattice, a wire cage, a wire spiral, or a rigid rod. According to embodiment and/or usage scenarios, the armature wire or segments comprise copper, aluminum, or a particular type of steel (including but not limited to carbon, galvanized, stainless, stress-hardened variants), and with or without any of various coatings. According to embodiment and/or usage scenarios, one or more of the signal interconnects and the inner structural framework are at least in part enclosed within one or more inner cavities of the flexible trigger arm 120.

According to embodiment and/or usage scenarios, the scanner module is a workgroup or department resource that is generally used by a plurality of users of the course of a day, including but not limited to being checked-in and checked-out or otherwise handed off from one work shift to the next. In such usage scenarios, the flexible trigger arm 120, and/or the fingerless glove 140, are ideally considered and treated as "personal" to respective users. That is, each of the respective users has their own flexible trigger arm 120, and/or fingerless glove 140, which they attach to and remove from the scanner module, respectively before and after their use of the scanner module (such as at the respective beginning and end of their shift).

According to embodiment and/or usage scenarios, the flexible trigger arm 120, and/or the fingerless glove 140, are "consumables", with relatively shorter lifetimes compared to that of the scanner module. In such usage scenarios, these consumables will likely need replacing (perhaps multiple times) before the life of the module is exceeded. It can thus be seen that different usage scenarios generally may dictate different approaches to the design, materials, and manufacture of the flexible trigger arm 120. More particularly, a plurality of embodiments for the flexible trigger arm 120, and/or the fingerless glove 140, are envisioned, with longer lifetime embodiments having generally greater cost in view of enhanced materials and/or design.

In various embodiments and/or usage scenarios, trigger button 125 activates a two-position, momentary contact, Normally Open (NO), Single Pole Single Throw (SPST), miniature snap-action switch. In various embodiments and/or usage scenarios, flexible trigger arm 120 has no active components and switch debounce is performed in scanner module firmware. According to embodiment and/or usage scenarios, the trigger activations are interpreted by the electronic device to perform one or more predetermined functions corresponding to respective user behaviors including one or more of various length press durations or various numbers of in-close-temporal-proximity press patterns. While the embodiment of FIG. 1 is detailed via a press-to-activate application, embodiments of the removable reversable flexible arm with trigger button are also contemplated for release-to-(de)activate (dead man's switch) applications. Those skilled in the art will appreciate that more generally the user may exercise the trigger button to change the switch contact state as called for by a given application, including for signaling or control via switch closure patterns.

In various embodiments and/or usage scenarios, simple fixed male pins, with complementary female receptacles, are used respectively for the trigger switch output contacts 122 and scanner input contacts 110C. In various embodiments and/or usage scenarios, so-called "pogo" pins (spring-loaded pins), with corresponding female "pogo" target receptacles, are used respectively for the trigger switch output contacts 122 and scanner input contacts 110C. According to embodiment and/or usage scenarios, trigger switch output contact pins 122 are mounted orthogonal (as illustrated in FIGS. 4-7) or parallel (not illustrated) to the long axis of the flexible trigger arm 120 and receiving scanner input contacts 110C are mounted accordingly. In various embodiments and/or usage scenarios, a common set of scanner input contacts 110C are shared by both right-handed and left-handed configurations of flexible trigger arm 120. According to embodiment and/or usage scenarios, the signal interconnect through the flexible trigger arm comprises parallel wires, twisted-pair wires, shielded wires, or coaxial cable.

In various embodiments and/or usage scenarios, user control(s) 114, comprises a single control button. According to embodiment and/or usage scenarios, the single control button performs one or more predetermined functions corresponding to respective user behaviors including one or more of various length press durations or various numbers of in-close-temporal-proximity press patterns. In various embodiments and/or usage scenarios, user indicator(s) 116 comprises indicators for battery status, application-specific status (including but not limited to a a scan status), and wireless link status.

In various "finger-to-palm" embodiments and/or usage scenarios, not illustrated, the flexible arm is instead positioned between the user's palm (including one or more of the upper palm, middle palm, thenar region, and hypothenar regions) and a selected finger (including but not limited to, the index finger or the middle finger) such that the flexible arm is captured between the palm and the selected finger when the trigger button is depressed by the selected finger (such as closing/clenching just the selected finger or the fist as a whole). The flexible arm keeps in close proximity to or pressing against the palm, such that the palm acts as a backstop to constrain movement of the flexible arm during button depression. Various dimensions of the flexible arm may be optimized specific for such "finger-to-palm" embodiments, including but not limited to, one or more of an increased length of the flexible arm, a different thickness of the arm at least near the "base" of (area surrounding) the button, and a different extent of the button's protrusion from the arm, all as suggested by ergonomics.

As illustrated, the top/outer surface presented to the user of trigger button 125 has a circular mesa-like geometry. In various embodiments and/or usage scenarios, not illustrated, the top/outer surface presented to the user of the trigger button is one or more of a rectangular mesa-like geometry, and a pseudo gun-trigger-like geometry.

FIG. 2 illustrates again, via a perspective view, a right-handed application 200 corresponding to the right-handed application 100 of FIG. 1, but sans the fingerless glove 140 and the user's hand 105, and with flexible thumb trigger arm assembly 120 attached but not yet configured. This view obliquely shows aspects of the scanner's upper portion, front, and side, as well as the visible front scanner-to-glove adapter 130.

FIG. 3 illustrates a right-handed application 300 corresponding to the right-handed application 200 of FIG. 2, via a different perspective view obliquely showing aspects of the scanner's lower portions, side, and front, and further shows visible front and rear scanner-to-glove adapters (respectively 130 and 132), and the flexible thumb trigger arm assembly 120 attached but not yet configured for a user's hand. According to embodiment and/or usage scenarios, scanner access panel 111 provides access to one or more removable batteries, or other internals of the scanner module.

Lower portion channel 113 (AKA channel 113) is a "through slot" formed immediately below the scanner middle portion 110M by the juxtaposition of front lower portion 110LF and rear lower portion 110LR. Channel 113 includes ridges 115 (on both the front and rear sides of the channel) that effectively act as claw/teeth-like protrusions for mating with and gripping the contact-pins end of the flexible trigger arm assembly 120 so as to provide an "interference fit" and reduce movement of the arm along the long axis of channel 113. The channel 113 in combination with trigger input contacts 110C can collectively be viewed as a socket, and the contact-pins end of flexible trigger arm 120 can be viewed as a plug. According to embodiment and/or usage scenarios, other types of switches may be plugged into the socket (of channel 113 and input contacts 110C), including but not limited to an application wherein the scanner module is placed on the end of a variation of a "selfie-stick".

FIG. 4 illustrates, via a perspective view, further selected physical details of the respective scanner and flexible trigger arm right-hand application embodiments of FIGS. 1-3. This view obliquely shows aspects of the scanner's upper portion, front, and a side, and further shows a visible front scanner-to-glove adapter 130, and flexible trigger arm 120 ready to be attached. FIG. 4 further illustrates trigger switch output contacts 122 (2 male pins) of the flexible trigger arm assembly.

Figure 5:
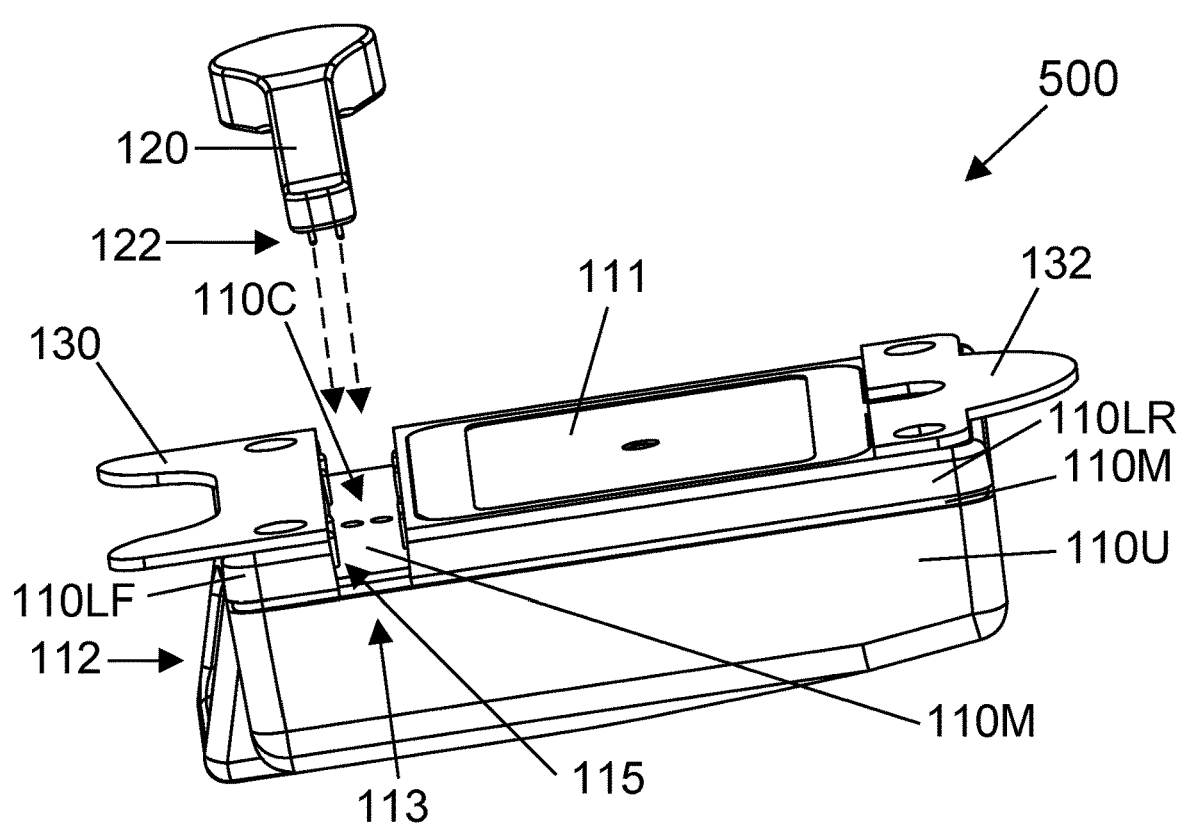
FIG. 5 illustrates, via a perspective view of the first embodiment, further selected physical details of the respective scanner and flexible trigger arm embodiments of FIGS. 1-4. This view obliquely shows aspects of the scanner's side, lower portions, and front.

FIG. 5 illustrates, via a perspective view, further selected physical details of the respective scanner and flexible trigger arm embodiments of FIGS. 1-4. This view obliquely shows aspects of the scanner's side, lower portions, and front. FIG. 5 further illustrates external trigger input contacts 110C (2 female receptacles). These contacts are in the center of channel 113, which can be seen in FIGS. 3 and 5 to be symmetric about the long axis of the scanner module 110. More particularly, it is bilaterally symmetric about the mid-sagittal plane of the module.

FIGS. 1-5 show the flexible trigger arm 120 oriented for mounting in the channel 113 to protrude from the scanner module on the side closest to the thumb 106 of the user's right hand 105. That is, the scanner for FIGS. 1-5 is optimally arranged and configured for right-handed use. According to user preference (but not illustrated), the flexible trigger arm 120 may instead be oriented for mounting in the channel 113 to protrude from the scanner module on the side closest to the thumb of the user's left hand. That is, the scanner may be optimally arranged and configured for left-handed use. Left-handed applications are illustrated by mirror-reversal across the vertical axis (AKA horizontally "flopping") each of the views of FIGS. 1, 2, and 4, and mirror-reversal across the horizontal axis (AKA vertically flipping) each of the views of FIGS. 3 and 5.

Figure 6:
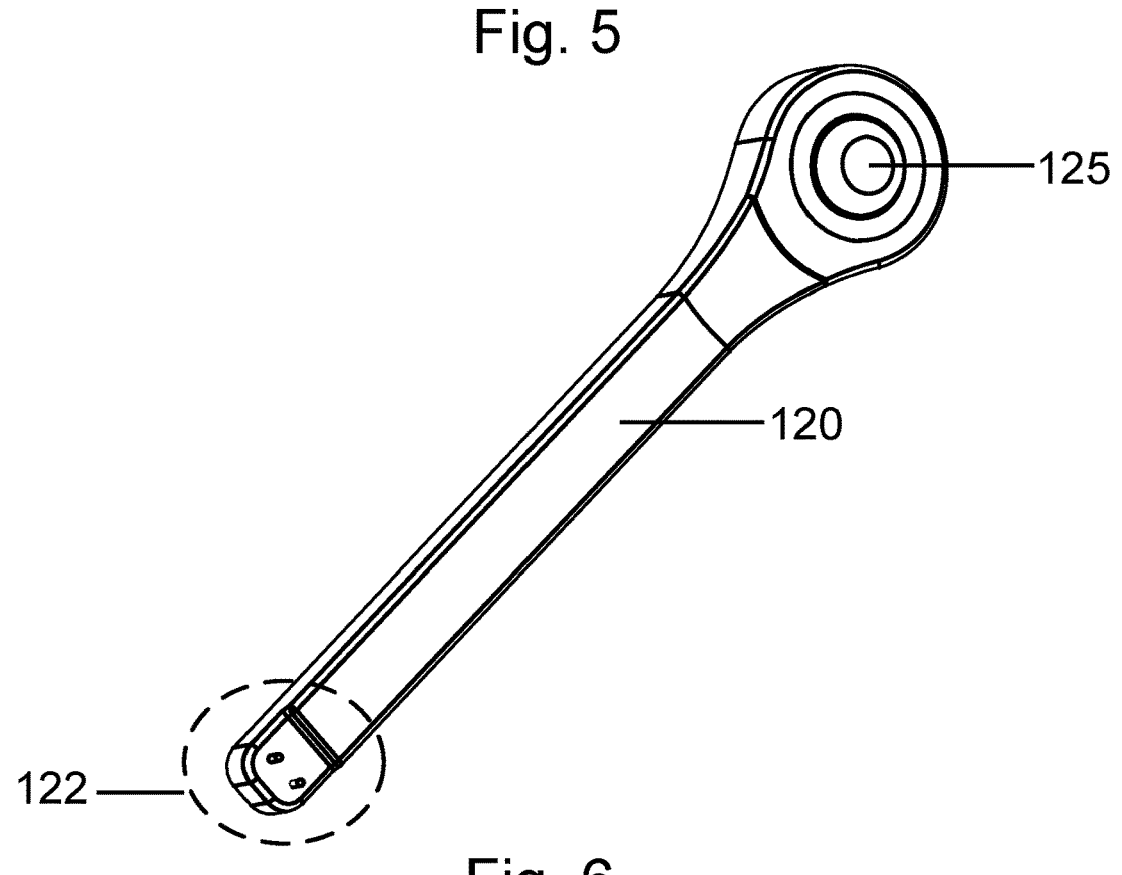
FIG. 6 illustrates, via a perspective view of the first embodiment, selected physical details of the flexible trigger arm assembly embodiment of FIGS. 1-5 and 7.
Figure 7A:
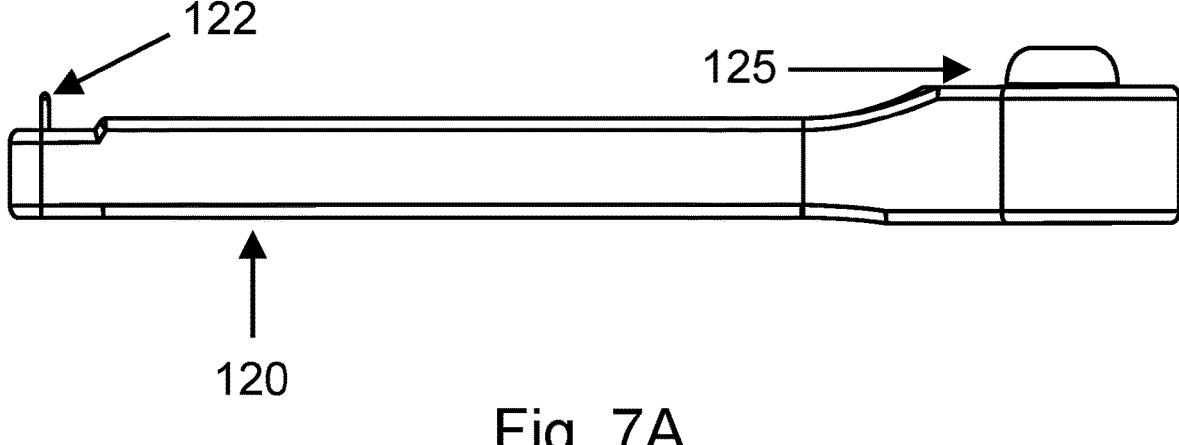
FIG. 7A illustrates, via a side view, selected aspects of the flexible trigger arm assembly of FIGS. 1-6 of the first embodiment.
Figure 7B:
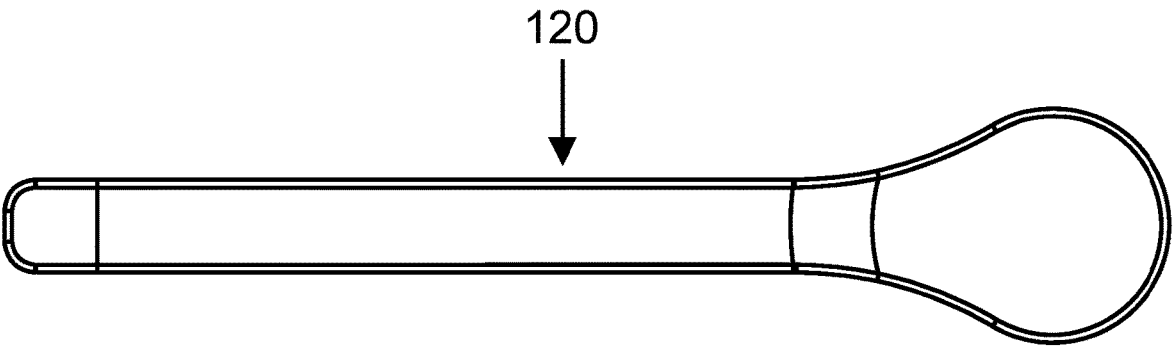
FIG. 7B illustrates, via a rear view, selected aspects of the flexible trigger arm assembly of FIGS. 1-6 of the first embodiment.

FIGS. 6, 7A, and 7B illustrate, via respective perspective, side, and rear views, selected physical details of the thumb trigger assembly 120 of the embodiment of FIGS. 1-5.

Ring Mount Thumb-Triggered Wearable Device and System

In a second or "ring mount" embodiment of a wearable application-specific electronic device, such as the scanning system illustrated in FIGS. 8-16, the thumb trigger assembly 220 comprises a simple flexible cable 220-2 (without any requirement for a particular stiffness) attached on one end to a trigger button ring assembly 220-3 to be worn on (secured to) a user's forefinger (index-finger). The wearing may be directly on the forefinger, or with intervening garment layers. The thumb trigger assembly 220 further comprises an "interface" or plug 220-1, with two male connector pins 222, the plug being attached to the end of the cable 220-2 opposite to that of the trigger button ring assembly 220-3.

The trigger button ring assembly 220-3 has a first upper (top, or head) or trigger button portion 250 with the trigger button 225 and into which the flexible cable 220-2 terminates. The ring assembly further has a second lower (bottom, base) or finger strap portion 275 (AKA positioning anchor) with respective attachment/tie points. In various embodiments and/or usage scenarios, the finger strap attachment points are respective D-ring-like loops on opposite sides of the base portion. These loops are suitable for attaching a strap (band, or belt) to secure the base portion of the ring assembly to the user's forefinger and are also suitable for instead more permanently attaching (e.g., via sewing or thermal bonding) the base portion to a glove, partial-glove, or a hand wrap.

In broad overview, the scanner module 210 (AKA scan module) proper of the ring mount embodiment corresponds to the assembly in the upper left of FIG. 11, sans the scanner-to-glove adapter 230, and more particularly comprises upper portion 210U, middle portion 210M (visible only in FIGS. 10 and 12), front lower portion 210LF, rear lower portion 210LR, access panel 211 (visible only in FIGS. 10 and 12), front optical scanner window 212, lower portion channel 213 (AKA slot; detailed below in the discussion of FIGS. 10 and 12), external trigger input contacts 210C (visible only in FIG. 12), user control(s) 214, and user indicator(s) 216.

FIG. 8 illustrates, via a perspective view, a right-handed application 800 of the ring mount embodiment of a wearable application-specific electronic device, here shown worn on the back of a user's hand 205, with a thumb trigger assembly 220 attached and configured (positioning the trigger button 225 into place for momentary depression by the user's thumb 206) for selective trigger signaling to the electronic device. The forefinger acts as a backstop to constrain movement of the trigger button ring assembly during button depression.

FIG. 9 illustrates, via a perspective view, a right-handed application 900 corresponding to the right-handed application 800 of FIG. 8, but sans the fingerless glove 240 and the user's hand 205, and with thumb trigger assembly 220 attached but not yet configured. This view obliquely shows aspects of the scanner's upper portion, front, and side.

FIG. 10 illustrates a right-handed application 1000 corresponding to the right-handed application 900 of FIG. 9, via a different perspective view obliquely showing aspects of the scanner's lower portions, side, and front, and further shows visible front and rear scanner-to-glove adapters (respectively 230 and 232), and the thumb trigger assembly 220 attached but not yet configured for a user's hand. In various embodiments and/or usage scenarios, hook-and-loop fasteners are adhesively attached to the lands of the glove adapters. The interface (AKA plug) 220-1 is retained within the right/left orientation channel 213 via two screws 223. While one screw would minimally suffice to retain the interface, the two screws better handle any cable stress and keeps the interface from laterally pivoting about the one screw. According to embodiment and/or usage scenarios, scanner access panel 211 provides access to one or more removable batteries, or other internals of the scanner module.

FIG. 11 illustrates scanner and thumb trigger assembly right-hand application 1100 via a perspective view showing further selected physical details of the respective embodiments of FIGS. 8-10. The upper left portion of FIG. 11 obliquely shows aspects of the scanner's 210 upper portion 210U, lower front 210LF, and side 210U. The lower portion of FIG. illustrates the thumb trigger assembly 220 ready to be attached to scanner module 210 and comprising (from left to right) interface (AKA plug) 220-1 with two male connector pins (AKA trigger switch output contacts) 222, cable 220-2, and trigger button ring assembly 220-3 with trigger button 225.

FIG. 12 illustrates, via a perspective view, further selected physical details of the respective scanner and ring mount embodiments of FIGS. 8-11. This view obliquely shows aspects of the scanner's side, lower portions, and front. FIG. 12 further illustrates external trigger input contacts 210C (2 female receptacles). These contacts are in the center of channel 213, which can be seen in FIGS. 10 and 12 to be symmetric about the long axis of the scanner module 210. More particularly, it is bilaterally symmetric about the mid-sagittal plane of the module.

FIGS. 8-12 show the thumb trigger assembly 220 oriented for mounting in the channel 213 to protrude from the scanner module on the side closest to the thumb 206 of the user's right hand 205. That is, the scanner of FIGS. 8-12 is optimally arranged and configured for right-handed use. As illustrated in FIG. 16A-16C, according to user preference, the thumb trigger assembly 220 may instead be oriented for mounting in the channel 213 to protrude from the scanner module on the side closest to the thumb of the user's left hand. That is, the scanner may be optimally arranged and configured for left-handed use. Left-handed applications are further illustrated by mirror-reversal across the vertical axis (AKA horizontally "flopping") each of the views of FIGS. 8, 9, and 11, and mirror-reversal across the horizontal axis (AKA vertically flipping) each of the views of FIGS. 10 and 12.

FIGS. 13, 14A, and 14B illustrate, via respective perspective, side, and rear views, selected physical details of the thumb trigger assembly 220 of the embodiment of FIGS. 8-12.

In various embodiments and/or usage scenarios, and as illustrated in FIGS. 15 and 16, the trigger button portion 250 of the ring assembly 220-3 is readily removably user-attachable to the second portion 275 of the ring assembly, using complementary geometries and various techniques such as snap-to-fit or magnetic attachment. In other embodiments the first and second portions are not user detachable, removing the need for any removable attachment means.

In some embodiments at least one magnet is used in combination with at least one ferrous metal or other ferromagnetic material. As an example, in the exemplary embodiment of FIGS. 15A and 15B, the head portion 250 of the ring assembly 220-3 comprises trigger button 225 enclosed in part by "button casing" 253, and a "button housing" 252 containing an adhesively attached and/or press fit magnet 251. Base portion 275 includes a mild steel disk 276 adhesively attached and/or press fit within a complementary round receiving area. The magnet 251 and steel disk 276 are sized and mounted such that they almost or just barely touch when the upper portion 250 and lower portion 275 of the ring assembly 220-3 are mated. In various embodiments and/or usage scenarios, magnet 251 is an epoxy coated round N42 type magnet—a Neodymium magnet with a nominal maximum energy product of 42 MGOe).

FIG. 16A and FIG. 16B illustrate a left-handed configuration of the ring mount embodiment, using a full glove 241 and wherein base portion 275 of ring assembly 220-3 has been attached/mounted on the forefinger sleeve of the glove. FIG. 16A shows how base portion 275, attached to full glove 241, is removably detachable from the other components of thumb trigger assembly 220, the other components remaining attached to scanner module 210. As the scanner module 210 may be removably attached to the glove 241 via hook-and-loop fasteners, the combination of scanner module 210 with cable 220-2 (attached via interface 220-1) and head portion 250, effectively becomes a scanning assembly 1600L—as identified in FIG. 16C—that the user/worker may removably attach and detach from full glove 241. FIG. 16D shows the analogous right-handed configuration—scanning assembly 1600R. FIG. 16B shows the head portion 250 of ring assembly 220-3 magnetically attached to the base portion 275 of the ring assembly 220-3 and ready for use.

In various embodiments and/or usage scenarios, after a one-time determination of the preferred placement on the glove forefinger of the base portion 275 and attachment thereto, and leaving the other components of thumb trigger assembly 220 attached to scanner module 210, the configuration of FIG. 16A and FIG. 16B presents distinct advantages. A user/worker so-equipped may more quickly transition between three roles/states: a bare-handed role (such as during a shift change, or performing tasks not warranting a glove), a hand protected but non-scanning work role (wearing glove 241 with previously attached base portion 275 but sans the scanning assembly), and a scanning-ready work role (of FIG. 16B).

Stitching 290 (or other retaining means) is used for the attachment of each of the positioning anchor loops of the base portion 275 to the sleeve/tube of forefinger 207 of glove 241. (In FIGS. 16A and 16B, only one of two instances of stitching 290 is visible.) Stitching 290 may employ any suitably strong stitch type (e.g., a double-thread buttonhole stitch) and/or webbing or textile interfacing. Attachment is also envisioned via other sewing and fastener-to-fabric attachment techniques, including gluing, thermal bonding, and combinations of these methods. It is also envisioned that in various embodiments and/or usage scenarios, the ferromagnetic material is more directly attached to/embedded in the glove-like garment without the loops of the finger strap (e.g., without base portion 275), such that the trigger button portion is removably user-attachable to the ferromagnetic material equipped glove-like garment.

CONCLUSION

Certain choices have been made in the description merely for convenience in preparing the text and drawings and unless there is an indication to the contrary the choices should not be construed per se as conveying additional information regarding structure or operation of the embodiments described. Examples of the choices include: the particular organization or assignment of the designations used for the figure numbering and the particular organization or assignment of the element identifiers (the callouts or numerical designators, e.g.) used to identify and reference the features and elements of the embodiments.

The words "includes" or "including" are specifically intended to be construed as abstractions describing logical sets of open-ended scope and are not meant to convey physical containment unless explicitly followed by the word "within." Language in the claims or elsewhere herein of the form of "at least one of A, . . . , and N" or "one or more of A, . . . , and N" and minor variations thereof should be understood to mean "one or more selected from the group of A, . . . , and N" (where ellipsis indicates an arbitrary plurality of group members). Furthermore, without express indication to the contrary such language is not meant to alter the open-ended scope of a claim or claim element. "AKA" is an abbreviation for "also known as".

Although the foregoing embodiments have been described in some detail for purposes of clarity of description and understanding, the invention is not limited to the details provided. There are many embodiments of the invention. The disclosed embodiments are exemplary and not restrictive.

It will be understood that many variations in construction, arrangement, and use are possible consistent with the description, and are within the scope of the claims of the issued patent. For example, interconnect and function-unit bit-widths, clock speeds, and the type of technology used are variable according to various embodiments in each component block. The names given to interconnect and logic are merely exemplary and should not be construed as limiting the concepts described. The order and arrangement of flowchart and flow diagram process, action, and function elements are variable according to various embodiments. Also, unless specifically stated to the contrary, value ranges specified, maximum and minimum values used, or other particular specifications (such as flash memory technology types; and the number of entries or stages in registers and buffers), are merely those of the described embodiments, are expected to track improvements and changes in implementation technology and should not be construed as limitations.

Functionally equivalent techniques known in the art are employable instead of those described to implement various components, sub-systems, operations, functions, routines, sub-routines, in-line routines, procedures, macros, or portions thereof. It is also understood that many functional aspects of embodiments are realizable selectively in either hardware (i.e., generally dedicated circuitry) or software (i.e., via some manner of programmed controller or processor), as a function of embodiment dependent design constraints and technology trends of faster processing (facilitating migration of functions previously in hardware into software) and higher integration density (facilitating migration of functions previously in software into hardware). Specific variations in various embodiments include but are not limited to: differences in partitioning; different form factors and configurations; use of different operating systems and other system software; use of different interface standards, network protocols, or communication links; and other variations to be expected when implementing the concepts described herein in accordance with the unique engineering and business constraints of a particular application.

The embodiments have been described with detail and environmental context well beyond that required for a minimal implementation of many aspects of the embodiments described. Those of ordinary skill in the art will recognize that some embodiments omit disclosed components or features without altering the basic cooperation among the remaining elements. It is thus understood that much of the details disclosed are not required to implement various aspects of the embodiments described. To the extent that the remaining elements are distinguishable from the prior art, components and features that are omitted are not limiting on the concepts described herein.

All such variations in design are insubstantial changes over the teachings conveyed by the described embodiments. It is also understood that the embodiments described herein have broad applicability to other computing and networking applications and are not limited to the particular application or industry of the described embodiments. The invention is thus to be construed as including all possible modifications and variations encompassed within the scope of the claims of the issued patent.

What is claimed is:

1. An apparatus comprising:
an application specific module for wearing atop the dorsal of a user's preferred hand, the module having an anterior side and a ventral side worn respectively oriented distally and proximally with respect to the user, the ventral near anterior of the module fully containing a transverse bilaterally symmetric channel having openings on each lateral side of the module;
a readily user attachable and user detachable thumb trigger assembly comprising a channel-plug end, an end having a trigger button, and an intermediate portion mechanically and electrically connecting the channel-plug end and the trigger button end;
wherein the thumb trigger assembly is removably mechanically and electrically mounted in the channel via the channel-plug end in a selected one of a left-handed and a right-handed reversible orientation in accordance with the user's preference, the mounted thumb trigger assembly protruding from the module only through the lateral side channel opening proximate to the user's preferred hand forefinger side;
wherein the module with mounted thumb trigger assembly is removably positionable via removable attachment atop the user's preferred hand;
wherein a thumb relative quasi static position of the trigger button is customizable for exercising the trigger button by the user's thumb to cause a module state change; and
wherein the intermediate portion is a cable and the trigger button end further comprises a magnet to removably hold the trigger button end against a forefinger worn ferromagnetic material to operatively hold the thumb relative position.

2. The apparatus of claim 1, wherein the application specific module is a data capture module and the exercising activates a data capture.

3. The apparatus of claim 1, wherein the application specific module is a scanner module and the exercising activates a scan.

4. The apparatus of claim 1, wherein the application specific module uses wireless techniques to access wireless tags.

5. The apparatus of claim 1, wherein the application specific module uses optical techniques to scan optical targets.

6. The apparatus of claim 1, wherein the trigger button end further comprises at least part of a forefinger ring.

7. The apparatus of claim 1, wherein the trigger button end further comprises a switch and the application specific module state change is in response to a state change of the switch caused by the exercising.

8. The apparatus of claim 1, wherein the wearing is via the removable positioning via removable attachment of the module with mounted thumb trigger assembly to a glove-like garment having no module associated electrical interconnect.

9. The apparatus of claim 1, wherein the wearing is via hook-and-loop attachment of the module with mounted thumb trigger assembly to a fingerless glove.

10. The apparatus of claim 1, wherein the customizable position is determined by user preference.

11. The apparatus of claim 1, wherein the customizable position is an optimal ergonomic placement determined in accordance with a chosen weighting of human factors.

12. The apparatus of claim 1, wherein the intermediate portion extends from the channel opening to follow alongside the user's forefinger in a manner determined in part by the removable positioning via removable attachment of the module with mounted thumb trigger assembly, and the length of the intermediate portion is limited to that required by a predetermined ergonomic range for the customizable position in accordance with reducing the physical hazard of exposed portions of the thumb trigger assembly.

13. A method comprising:

identifying a preferred hand of a user of an application specific module, the preferred hand having an associated forefinger, the module having a front side, a bottom, and an identified preferred hand forefinger side;

attaching a removable left/right-hand-reversible thumb trigger assembly to the module in accordance with the user's preferred hand via a transverse bilaterally symmetric channel fully in the bottom front of the module, wherein the attached thumb trigger assembly protrudes in part only from the forefinger side of the channel in the near front of the module;

removably positioning the module with attached thumb trigger assembly atop the back of the user's hand via removable attachment to a glove-like garment worn on the user's preferred hand, the module with attached thumb trigger assembly oriented on the garment with the module front side facing away from the user's wrist and the module bottom proximate to the back of the user's hand, the positioning being according to predetermined criteria for placement of a trigger button of the thumb trigger assembly;

exercising the trigger button by the user's thumb to cause a module state change; and wherein the thumb trigger assembly comprises a plug end for the attaching to the channel, a cable, and a trigger button end for the trigger button, and the trigger button end further comprises a magnet to removably hold the trigger button end against a forefinger worn ferromagnetic material to operatively hold the trigger button placement relative to the user's thumb.

14. The method of claim 13, wherein the application specific module is a data capture module and the exercising activates a data capture.

15. The method of claim 13, wherein the application specific module is a scanner module and the exercising activates a scan.

16. The method of claim 13, wherein the application specific module uses wireless techniques to access wireless tags.

17. The method of claim 13, wherein the application specific module uses optical techniques to scan optical targets.

18. The method of claim 13, wherein the trigger button end further comprises at least part of a forefinger ring.

19. The method of claim 13, wherein the thumb trigger assembly further comprises a switch and the module state change is in response to a state change of the switch caused by the exercising.

20. The method of claim 13, wherein other than via the removable attachment, the garment has no module associated electrical interconnect.

21. The method of claim 13, wherein the attachment to the garment is via hook-and-loop attachment of the module with attached thumb trigger assembly to a fingerless glove.

22. The method of claim 13, wherein the trigger button placement is determined by user preference.

23. The method of claim 13, wherein the trigger button placement is an optimal ergonomic placement determined in accordance with a chosen weighting of human factors.

24. The method of claim 13, wherein the attached thumb trigger assembly extends from the forefinger side of the channel protrusion to follow alongside the user's forefinger in a manner determined in part by the removably positioning via removable attachment of the module with attached thumb trigger assembly, and the length of the thumb trigger assembly is limited to that required by a predetermined ergonomic range for the trigger button placement in accordance with reducing the physical hazard of exposed portions of the thumb trigger assembly.

* * * * *